(12) United States Patent
Iwamoto et al.

(10) Patent No.: US 9,748,939 B2
(45) Date of Patent: Aug. 29, 2017

(54) OUTPUT CIRCUIT AND INTEGRATED CIRCUIT

(71) Applicant: SOCIONEXT INC., Yokohama-shi, Kanagawa (JP)

(72) Inventors: Keiko Iwamoto, Kawasaki (JP); Tohru Mizutani, Santa Clara County, CA (US); Takao Kono, Kunitachi (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/984,813

(22) Filed: Dec. 30, 2015

(65) Prior Publication Data

US 2016/0218705 A1 Jul. 28, 2016

(30) Foreign Application Priority Data

Jan. 27, 2015 (JP) .................................. 2015-013485

(51) Int. Cl.
*H03B 1/00* (2006.01)
*H03K 3/00* (2006.01)
*H03K 5/24* (2006.01)
*H03K 19/0175* (2006.01)

(52) U.S. Cl.
CPC ....... *H03K 5/24* (2013.01); *H03K 19/017509* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 5,179,293 A | * | 1/1993 | Hilton | ................ H03K 19/0826 326/51 |
| 5,557,221 A | | 9/1996 | Taguchi et al. | |
| 6,072,342 A | * | 6/2000 | Haider | ................ G06F 13/4086 327/112 |
| 6,127,840 A | * | 10/2000 | Coteus | ................ H04L 25/0278 326/30 |
| 6,323,675 B1 | * | 11/2001 | Whitworth | .......... H04L 25/0278 326/30 |
| 7,459,930 B2 | * | 12/2008 | Mei | ...................... G11C 7/1051 326/27 |

(Continued)

FOREIGN PATENT DOCUMENTS

JP 06-104725 A 4/1994
JP 11-239049 A 8/1999

*Primary Examiner* — Adam Houston
(74) *Attorney, Agent, or Firm* — Arent Fox LLP

(57) ABSTRACT

An output circuit has: a first driver circuit configured to receive a voltage of an input terminal and output a first voltage to an output terminal; a first comparison circuit configured to compare a first reference voltage with a voltage of the output terminal; a second driver circuit configured to receive the voltage of the input terminal and output a second voltage to the output terminal and become an off state according to a comparison result of the first comparison circuit; a second comparison circuit configured to compare a second reference voltage different from the first reference voltage with the voltage of the output terminal; and a third driver circuit configured to receive the voltage of the input terminal and output a third voltage to the output terminal and become an off state according to a comparison result of the second comparison circuit.

13 Claims, 23 Drawing Sheets

(56) References Cited

U.S. PATENT DOCUMENTS

| | | | | |
|---|---|---|---|---|
| 7,719,309 B2* | 5/2010 | Santurkar | .......... | H03K 19/0005 326/30 |
| 8,947,119 B2* | 2/2015 | Jang | .............. | H03K 17/16 326/30 |
| 2012/0008428 A1* | 1/2012 | Yoon | ............ | G11C 7/1051 365/189.07 |
| 2013/0234760 A1* | 9/2013 | Wang | ............ | G11C 7/1057 327/108 |
| 2016/0191049 A1* | 6/2016 | Lee | ................. | G06F 1/26 327/109 |
| 2016/0218705 A1* | 7/2016 | Iwamoto | .......... | H03K 19/01750 |

* cited by examiner

F I G. 1
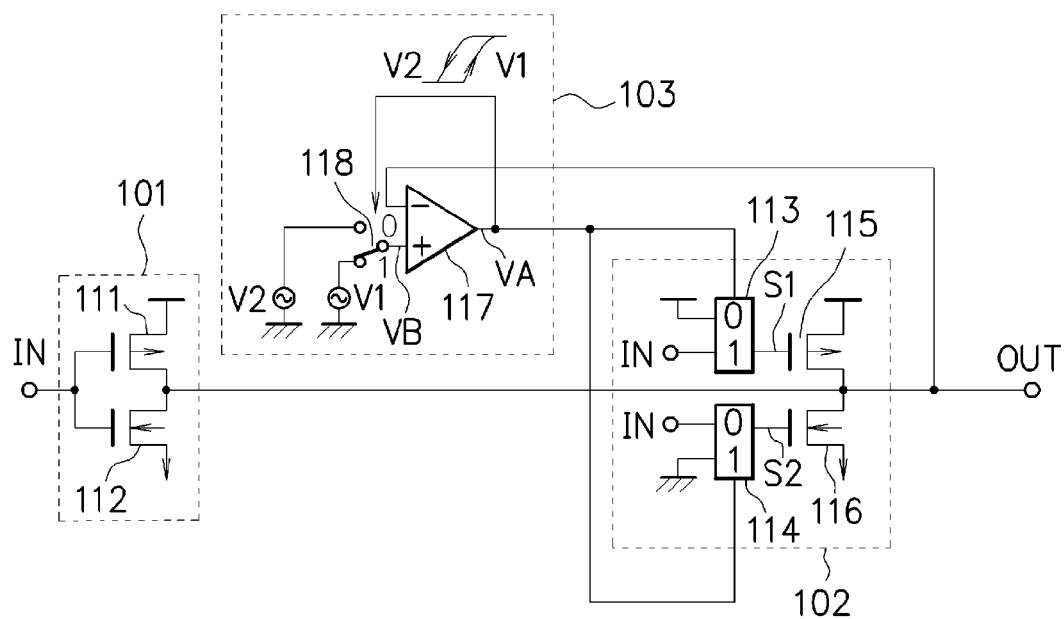
F I G. 2A
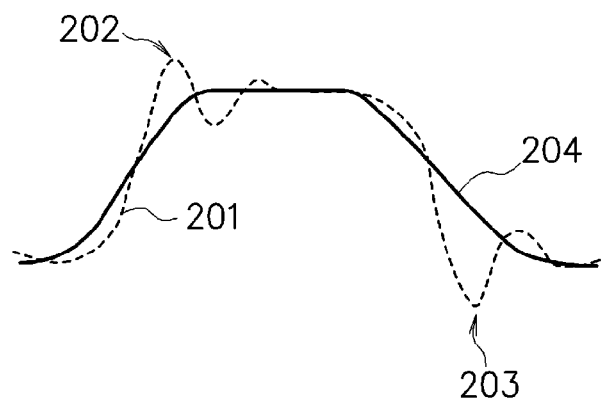
F I G. 2B
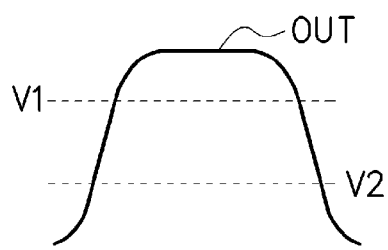

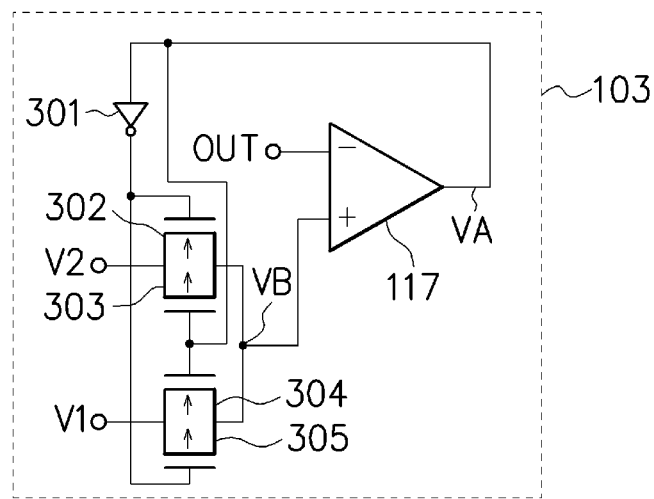
F I G. 3A
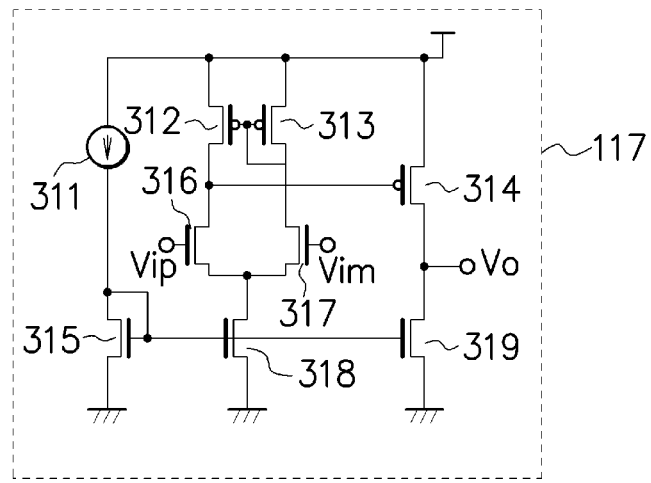
F I G. 3B
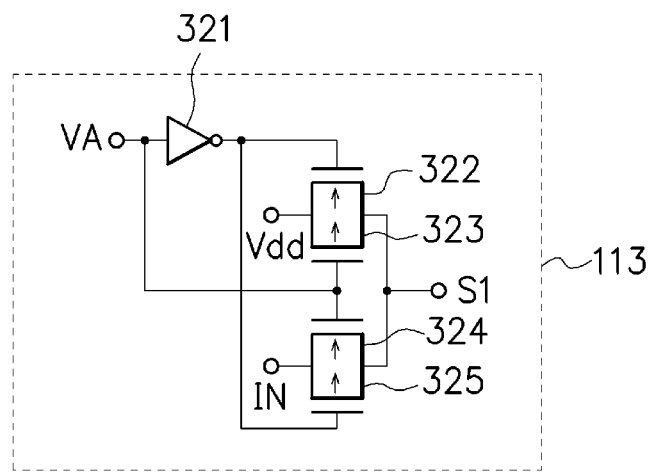
F I G. 3C

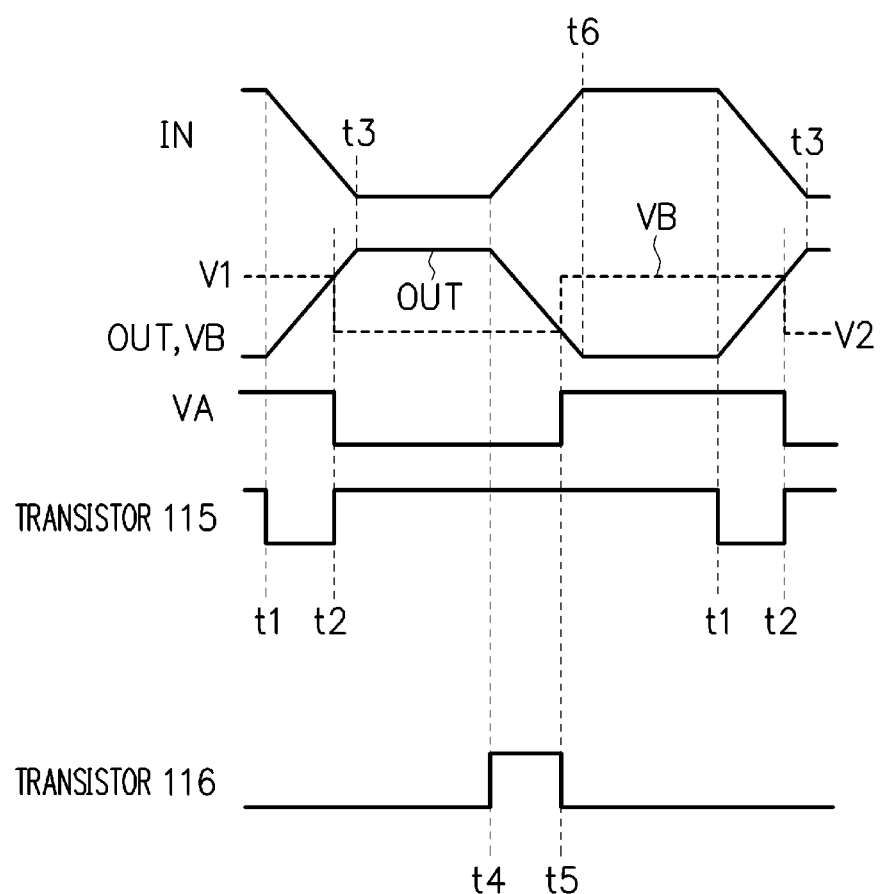
F I G. 4

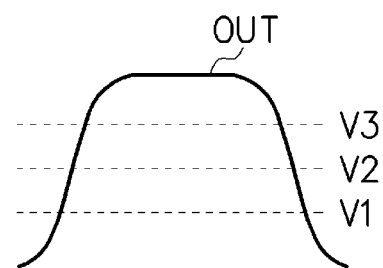
F I G. 6A
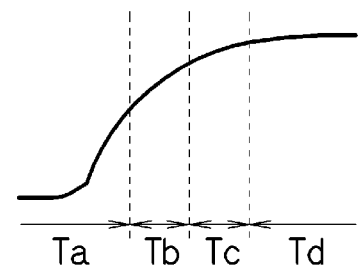
F I G. 6B

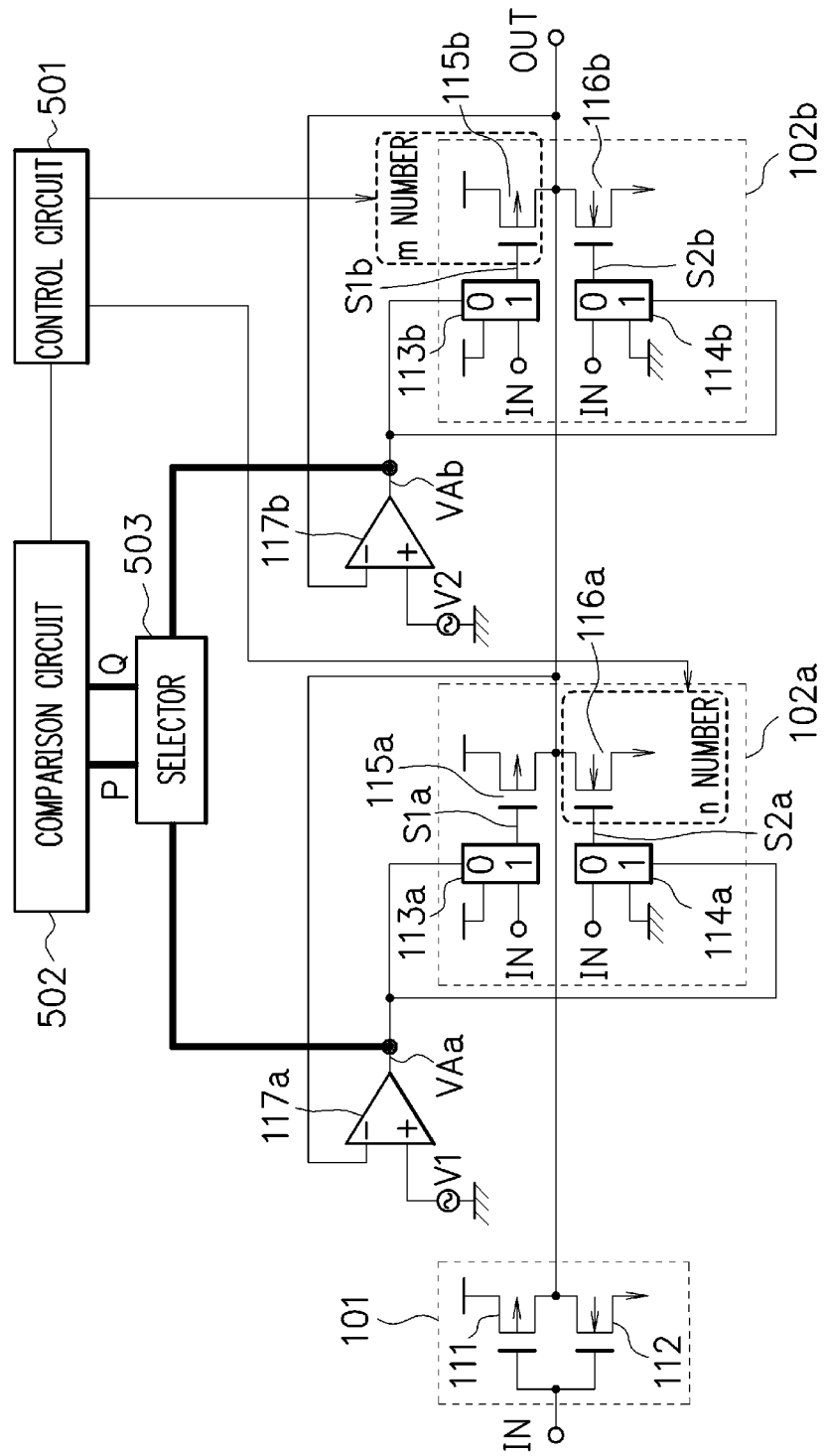
F I G. 7

F I G. 8A
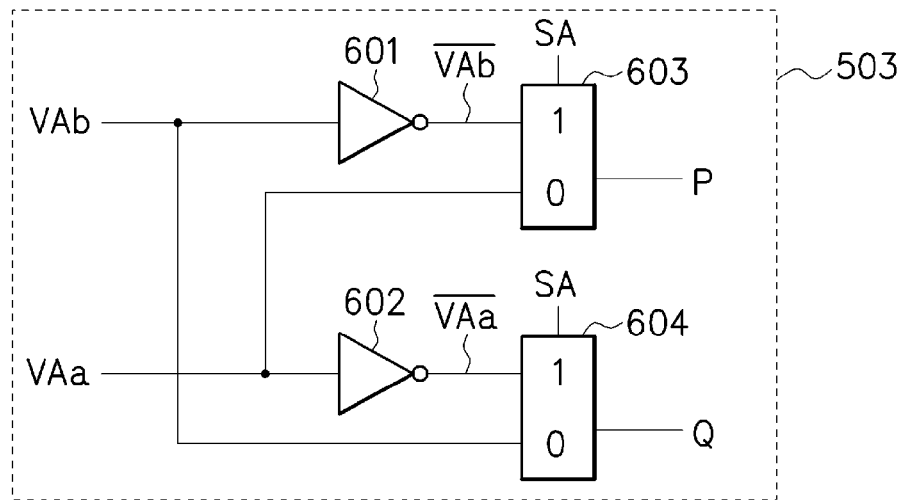
F I G. 8B
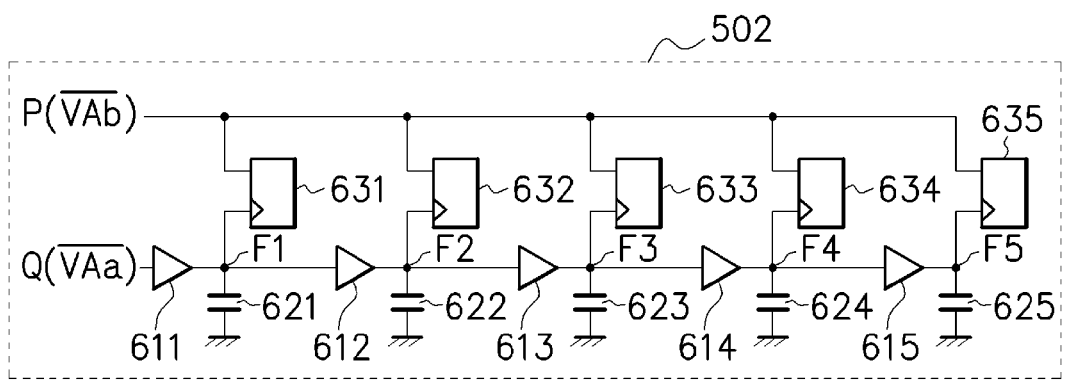
F I G. 8C
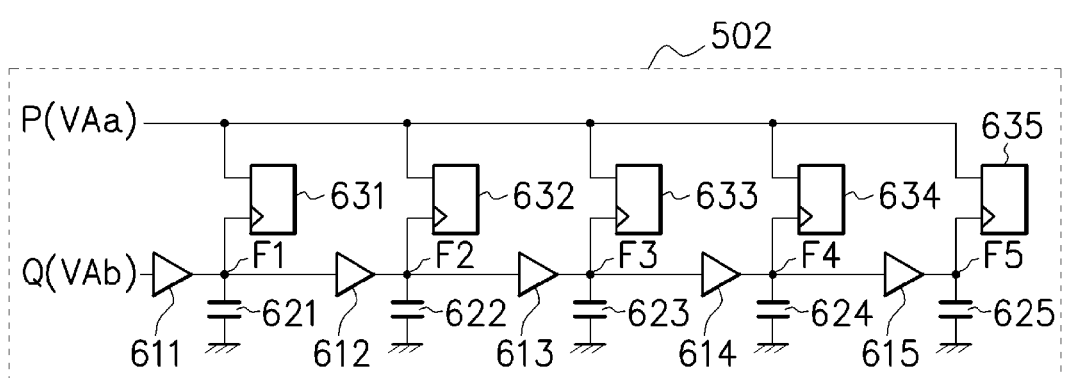

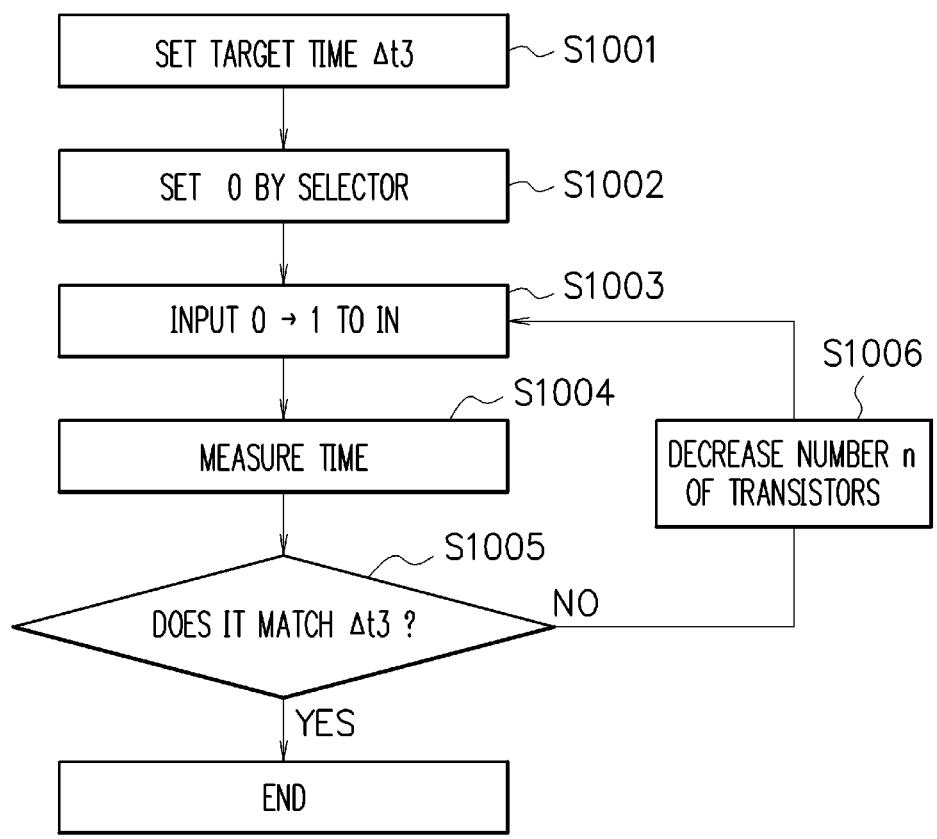
F I G. 12

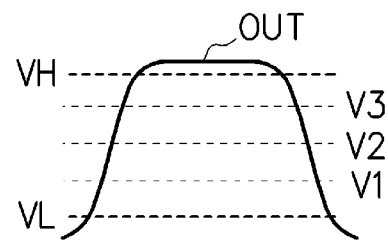
F I G. 21A
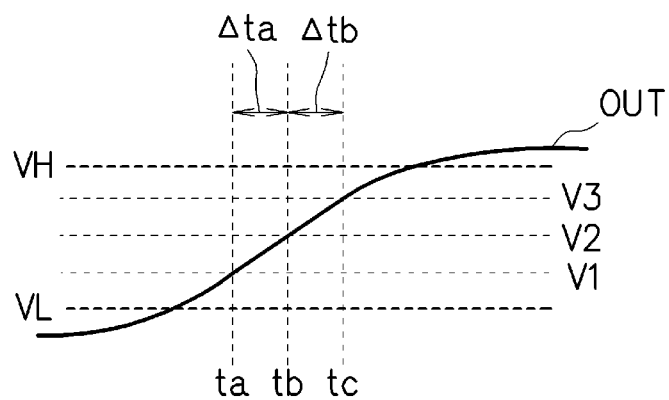
F I G. 21B
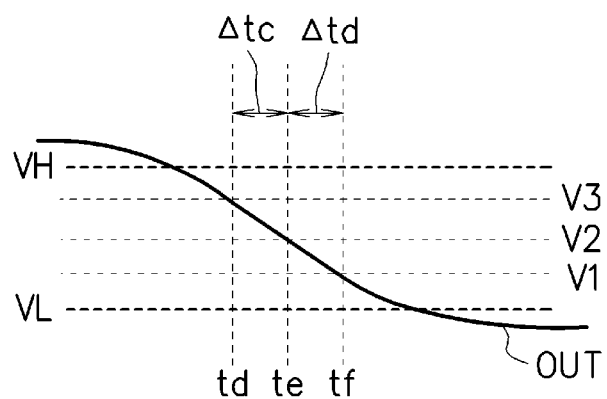
F I G. 21C

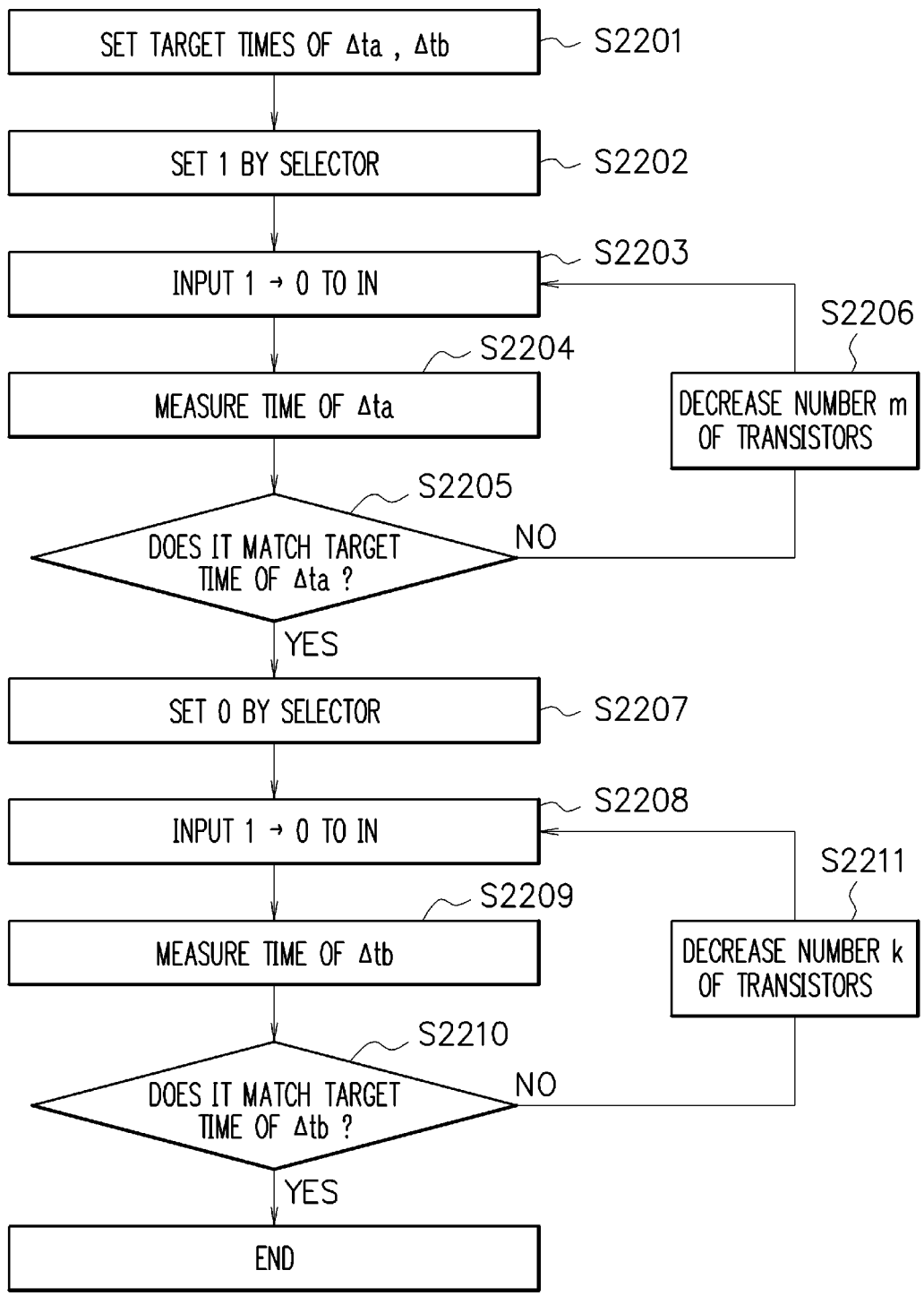
F I G. 22

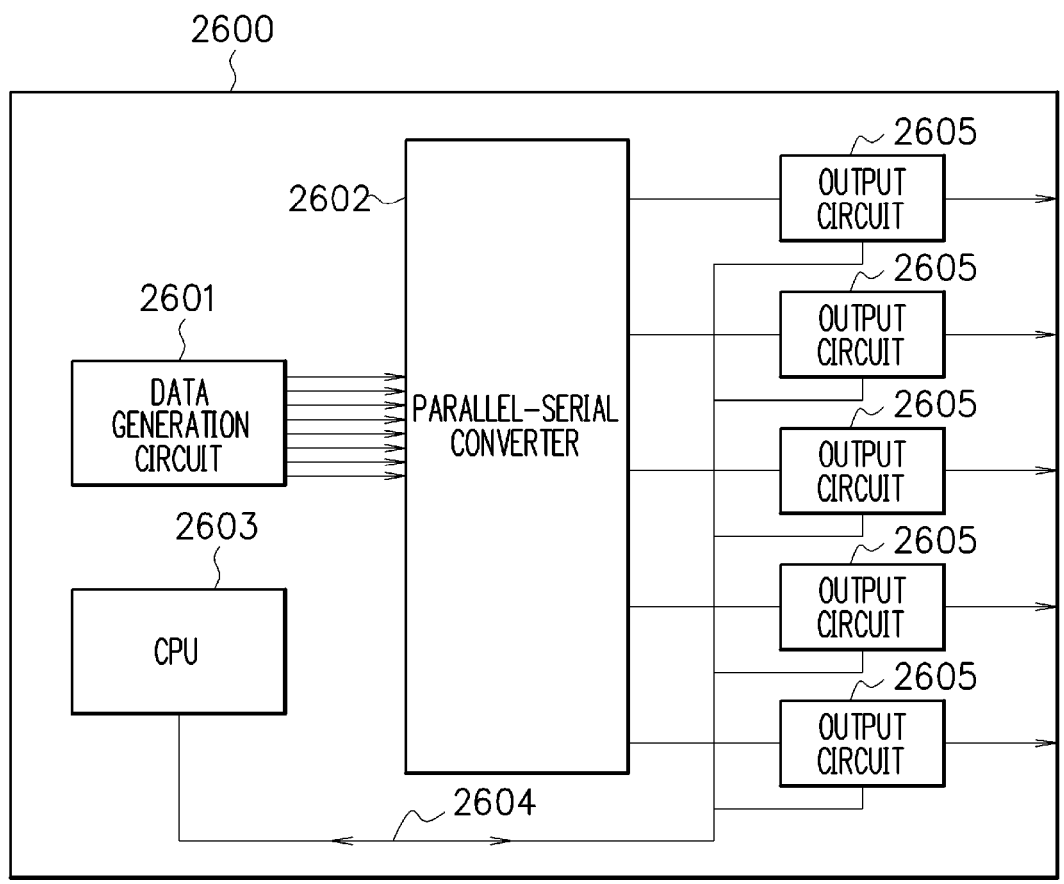
F I G. 26

OUTPUT CIRCUIT AND INTEGRATED CIRCUIT

CROSS-REFERENCE TO RELATED APPLICATION

This application is based upon and claims the benefit of priority of the prior Japanese Patent Application No. 2015-013485, filed on Jan. 27, 2015, the entire contents of which are incorporated herein by reference.

FIELD

The embodiments discussed herein are directed to an output circuit and an integrated circuit.

BACKGROUND

An input-output circuit capable of eliminating ringing by cooperation of an input circuit and an acceleration circuit has been known (see Patent Literature 1). Data lines outside a chip connected to an I/O terminal are doubly driven by two transistors, facilitating potential drop of a node. After a predetermined time passes, when level of the node is determined to be L logic, H logic is outputted from the input circuit, and thereby transistors of the acceleration circuit turn off. Data lines outside the chip connected to the I/O terminal are singly driven by one output transistor, and thus potential variations of the node become gradual, avoiding waveform distortion such as ringing.

There has been known a data output circuit having a transmission line driving unit which drives a transmission line according to input data, and a data transition detection unit which detects a transition of input data or a transition of output data of the transmission line driving unit (see Patent Literature 2). For a predetermined period since the data transition detection unit detected a transition of data, driving capability of the transmission line driving unit is enhanced.

Patent Literature 1: Japanese Laid-open Patent Publication No. 6-104725
Patent Literature 2: Japanese Laid-open Patent Publication No. 11-239049

Double driving by two transistors enables fast driving. However, when driving capability is enhanced, an impedance mismatch occurs, and an overshoot or an undershoot of output voltage occurs, making it not possible to transmit a desired signal.

SUMMARY

An output circuit has: a first driver circuit configured to receive a voltage of an input terminal and output a first voltage to an output terminal; a first comparison circuit configured to compare a first reference voltage with a voltage of the output terminal; a second driver circuit configured to receive the voltage of the input terminal and output a second voltage to the output terminal and become an off state according to a comparison result of the first comparison circuit; a second comparison circuit configured to compare a second reference voltage different from the first reference voltage with the voltage of the output terminal; and a third driver circuit configured to receive the voltage of the input terminal and output a third voltage to the output terminal and become an off state according to a comparison result of the second comparison circuit.

Further, an output circuit has: a first driver circuit, to which a voltage of an input terminal is inputted, configured to output a voltage to an output terminal; a comparison circuit configured to compare a first reference voltage with a voltage of the output terminal at a time of rising of the voltage of the output terminal, and compare a second reference voltage different from the first reference voltage with the voltage of the output terminal at a time of falling of the voltage of the output terminal; and a second driver circuit, to which the voltage of the input terminal is inputted, configured to output a voltage to the output terminal and become an off state according to a comparison result of the comparison circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a circuit diagram illustrating a configuration example of an output circuit according to a first embodiment;

FIG. 2A is a diagram illustrating a voltage waveform of an output terminal;

FIG. 2B is a voltage waveform for explaining operation of a hysteresis comparison circuit;

FIG. 3A is a circuit diagram illustrating a configuration example of the hysteresis comparison circuit of FIG. 1;

FIG. 3B is a circuit diagram illustrating a configuration example of a comparison circuit of FIG. 3A;

FIG. 3C is a circuit diagram illustrating a configuration example of a first selector of FIG. 1;

FIG. 4 is a timing chart for explaining operation of the output circuit of FIG. 1;

FIG. 6A is a voltage waveform diagram for explaining operation of the output circuit of FIG. 5;

FIG. 6B is a voltage waveform diagram at the time of rising of an output terminal after control of driving;

FIG. 7 is a circuit diagram illustrating a configuration example of an output circuit according to a third embodiment;

FIG. 8A is a circuit diagram illustrating a configuration example of a selector of FIG. 7;

FIGS. 8B and 8C are circuit diagrams illustrating configuration examples of a measurement circuit of FIG. 7;

FIG. 12 is a flowchart illustrating a processing example in which the output circuit controls the number of parallel connections of n-channel field effect transistors;

FIG. 21A is a voltage waveform diagram of an output terminal;

FIG. 21B is a diagram illustrating a voltage waveform at the time of rising of the output terminal;

FIG. 21C is a diagram illustrating a voltage waveform at the time of falling of the output terminal;

FIG. 22 is a flowchart illustrating a processing example in which the output circuit controls the numbers of parallel connections of p-channel field effect transistors;

FIG. 26 is a diagram illustrating a configuration example of an integrated circuit according to a sixth embodiment.

DESCRIPTION OF EMBODIMENTS

First Embodiment

Figure 5:
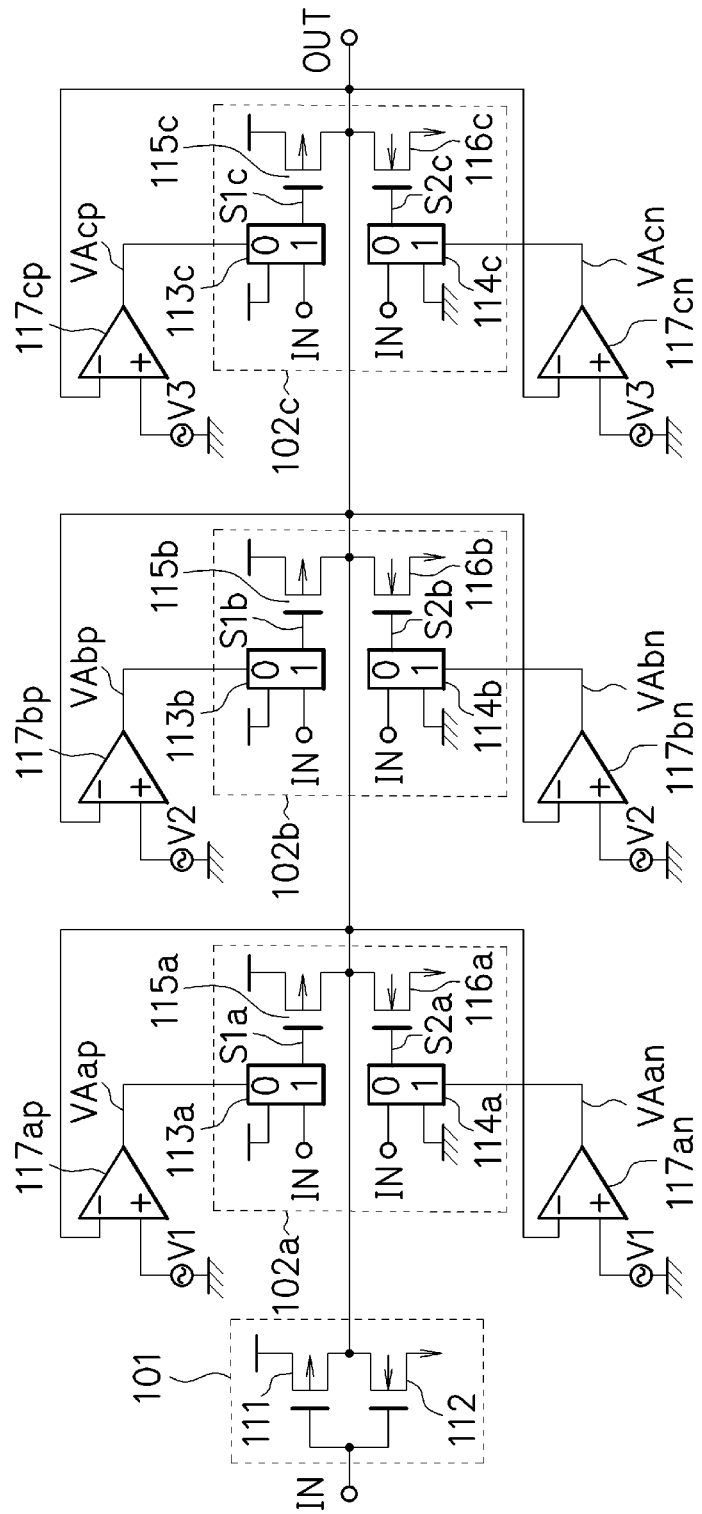
FIG. 5 is a circuit diagram illustrating a configuration example of an output circuit according to a second embodiment.

FIG. 1 is a circuit diagram illustrating a configuration example of an output circuit according to a first embodiment. The output circuit has a first driver circuit 101, a second driver circuit 102 and a hysteresis comparison circuit 103, to which a voltage of an input terminal IN is inputted, and which outputs a voltage to an output OUT. To the input terminal IN, a voltage of binary data is inputted.

The first driver circuit 101 has a p-channel field effect transistor 111 and an n-channel field effect transistor 112. The p-channel field effect transistor 111 has a source connected to a power supply potential node (first potential node), a gate connected to the input terminal IN, and a drain connected to an output terminal OUT. The n-channel field effect transistor 112 has a source connected to a ground potential node (second potential node), a gate connected to the input terminal IN, and a drain connected to the output terminal OUT. Here, a power supply potential (first potential) is a positive potential when the ground potential (second potential) is 0 V. That is, the power supply potential (first potential) is higher than the ground potential (second potential). The first driver circuit 101, to which a voltage of the input terminal IN is inputted, outputs a voltage to the output terminal OUT. Specifically, the first driver circuit 101 is an inverter and outputs a logically inverted voltage of the voltage of the input terminal IN to the output terminal OUT.

The hysteresis comparison circuit 103 has a comparison circuit 117 and a switch 118. The switch 118 supplies, when the value of output voltage VA of the comparison circuit 117 is "1" (high level), a first reference voltage V1 to a positive input node of the comparison circuit 117 and supplies, when the value of the output terminal VA of the comparison circuit 117 is "0" (low level), a second reference voltage V2 to the positive input node of the comparison circuit 117. A voltage VB is the voltage of the positive input node of the comparison circuit 117. As illustrated in FIG. 2B, the first reference voltage V1 is higher than the second reference voltage V2. To a negative input node of the comparison circuit 117, a voltage of the output terminal OUT is inputted. The comparison circuit 117 outputs a voltage VA with a value "1" when the voltage of the positive input node is higher than the voltage of the negative input node, and outputs a voltage VA with a value "0" when the voltage of the positive input node is lower than the voltage of the negative input node.

The second driver circuit 102 has a first selector 113, a second selector 114, a p-channel field effect transistor 115 and an n-channel field effect transistor 116. The first selector 113 outputs the power supply potential (positive potential) as a voltage S1 when the voltage VA has a value "0", and outputs the voltage of the input terminal IN as the voltage S1 when the voltage VA has a value "1". The second selector 114 outputs the ground potential as a voltage S2 when the voltage VA has a value "1", and outputs the voltage of the input terminal IN as the voltage S2 when the voltage VA has a value "0". The p-channel field effect transistor 115 has a source connected to the power supply potential node (positive potential node), a gate connected to a line of the voltage S1, and a drain connected to the output terminal OUT. The n-channel field effect transistor 116 has a source connected to the ground potential node, a gate connected to a line of the voltage S2, and a drain connected to the output terminal OUT.

FIG. 2A is a diagram illustrating a voltage waveform of the output terminal OUT. A voltage waveform 201 is a voltage waveform of the output terminal OUT when the gates of the p-channel field effect transistor 115 and the n-channel field effect transistor 116 are constantly connected to the input terminal IN. In this case, both the first driver circuit 101 and the second driver circuit 102 operate constantly and hence the driving speed is high, but an overshoot 202 and an undershoot 203 occur. On the other hand, a voltage waveform 204 is a desired voltage waveform of the output terminal OUT for binary data. In this embodiment, the first selector 113 controls the gate voltage of the p-channel field effect transistor 115 and the second selector 114 controls the gate voltage of the n-channel field effect transistor 116, and thereby the overshoot 202 and the undershoot 203 can be reduced.

FIG. 2B is a voltage waveform for explaining operation of the hysteresis comparison circuit 103. The first reference voltage V1 is higher than the second reference voltage V2. First, operation at the time of rising of the voltage of the output terminal OUT will be explained. When the voltage of the output terminal OUT is at low level, the voltage of the output terminal OUT is lower than the first reference voltage V1 and the second reference voltage V2, and thus the comparison circuit 117 outputs the voltage VA with a value "1". In this case, a switch 108 supplies the first reference voltage V1 to the positive input node of the comparison circuit 117. The voltage of the output terminal OUT rises from low level to high level. The comparison circuit 117 maintains the value "1" of the voltage VA in a period in which the voltage of the output terminal OUT is lower than the first reference voltage V1. When the voltage of the output terminal OUT becomes higher than the first reference voltage V1, the comparison circuit 117 outputs the voltage VA with a value "0". In a period in which the voltage of the output terminal OUT is at high level, the voltage VA becomes a value "0". When the voltage VA becomes a value "0", the switch 108 supplies the second reference voltage V2 to the positive input node of the comparison circuit 117.

Next, operation at the time of falling of the voltage of the output terminal OUT will be explained. The voltage of the output terminal OUT falls from high level to low level. The comparison circuit 117 maintains the value "0" of the voltage VA in a period in which the voltage of the output terminal OUT is higher than the second reference voltage V2. When the voltage of the output terminal OUT becomes lower than the second reference voltage V2, the comparison circuit 117 outputs the voltage VA with a value "1". In a period in which the voltage of the output terminal OUT is at low level, the voltage VA becomes a value "1". The switch 108 supplies, when the voltage VA becomes a value "1", the first reference voltage V1 to the positive input node of the comparison circuit 117.

FIG. 3A is a circuit diagram illustrating a configuration example of the hysteresis comparison circuit 103 of FIG. 1. The hysteresis comparison circuit 103 has a comparison circuit 117, an inverter 301, n-channel field effect transistors 302, 304, and p-channel field effect transistors 303, 305. The inverter 301, the n-channel field effect transistors 302, 304 and the p-channel field effect transistors 303, 305 correspond to the switch 118 of FIG. 1.

When the voltage VA has a value "1", the n-channel field effect transistor 304 and the p-channel field effect transistor 305 turn on, and the n-channel field effect transistor 302 and the p-channel field effect transistor 303 turn off. Hence, the first reference voltage V1 is supplied as the voltage VB to the positive input node of the comparison circuit 117.

When the voltage VA has a value "0", the n-channel field effect transistor 302 and the p-channel field effect transistor 303 turn on, and the n-channel field effect transistor 304 and the p-channel field effect transistor 305 turn off. Hence, the second reference voltage V2 is supplied as the voltage VB to the positive input node of the comparison circuit 117.

FIG. 3B is a circuit diagram illustrating a configuration example of the comparison circuit 117 of FIG. 3A. The comparison circuit 117 has a current supply 311, p-channel field effect transistors 312 to 314, n-channel field effect transistors 315 to 319, a positive input node Vip, a negative input node Vim and an output node Vo. The voltage VB is inputted to the positive input node Vip. The voltage of the output terminal OUT is inputted to the negative input node Vim. The voltage VA is outputted from the output node Vo. When the voltage of the positive input node Vip is higher than voltage of the negative input node Vim, the output node Vo outputs the voltage VA with a value "1". When the voltage of the positive input node Vip is lower than voltage of the negative input node Vim, the output node Vo outputs the voltage VA with a value "0".

FIG. 3C is a circuit diagram illustrating a configuration example of the first selector 113 of FIG. 1. The first selector 113 has an inverter 321, n-channel field effect transistors 322, 324 and p-channel field effect transistors 323, 325. Note that the second selector 114 has the same configuration as the first selector 113. Hereinafter, the first selector 113 will be explained as an example.

When the voltage VA has a value "0", the n-channel field effect transistor 322 and the p-channel field effect transistor 323 turn on, and the n-channel field effect transistor 324 and the p-channel field effect transistor 325 turn off. Hence, the power supply potential of a power supply potential node Vdd is supplied as the voltage S1 to the gate of the p-channel field effect transistor 115.

When the voltage VA has a value "1", the n-channel field effect transistor 324 and the p-channel field effect transistor 325 turn on, and the n-channel field effect transistor 322 and the p-channel field effect transistor 323 turn off. Hence, the voltage of the input terminal IN is supplied as the voltage S1 to the gate of the p-channel field effect transistor 115.

FIG. 4 is a timing chart for explaining operation of the output circuit of FIG. 1. In FIG. 4, low level of the p-channel field effect transistor 115 represents an operating state, and high level thereof represents a non-operating state (off state). High level of the n-channel field effect transistor 116 represents an operating state, and low level thereof represents a non-operating state (off state). The first driver circuit 101 is an inverter and outputs a logically inverted voltage of the voltage of the input terminal IN to the output terminal OUT.

Times t1 to t3 are a period in which the voltage of the output terminal OUT rises from low level to high level. At time t1, the voltage of the output terminal OUT is at low level. The voltage VA is at high level, and thus the voltage VB of the positive input node of the comparison circuit 117 is the first reference voltage V1. The low level voltage of the output terminal OUT is lower than the first reference voltage V1, and thus the voltage VA at high level is outputted. In this case, the first selector 113 connects the input terminal IN to the gate of the p-channel field effect transistor 115. At this time, the voltage of the input terminal IN is at high level, and thus the p-channel field effect transistor 115 is in an off state. The second selector 114 connects the ground potential node to the gate of the n-channel field effect transistor 116. Hence, the n-channel field effect transistor 116 is in an off state.

Next, at times t1 to t2, the voltage of the output terminal OUT is lower than the first reference voltage V1, and thus the voltage VA maintains high level. In this period, the voltage of the input terminal IN becomes lower than high level, and thus the p-channel field effect transistor 115 becomes an operating state. Hence, the output circuit has high driving capability and can drive at high speed at the time of rising.

At time t2, the voltage of the output terminal OUT becomes higher than the first reference voltage V1, and the voltage VA becomes low level. Hence, the voltage VB of the positive input node of the comparison circuit 117 becomes the second reference voltage V2. At times t2 to t5, the voltage of the output terminal OUT is higher than the second reference voltage V2, and thus the comparison circuit 117 maintains the voltage VA at low level. Hence, the first selector 113 connects the power supply potential node to the gate of the p-channel field effect transistor 115, and the p-channel field effect transistor 115 becomes an oft state. Hence, the overshoot 202 of FIG. 2A can be reduced.

Times t4 to t6 are a period in which the voltage of the output terminal OUT falls from high level to low level. At times t4 to t6, the voltage of the output terminal OUT is higher than the second reference voltage V2, and thus the voltage VA maintains low level. In this period, the voltage of the input terminal IN becomes higher than low level, and thus the n-channel field effect transistor 116 becomes an operating state. Hence, the output circuit has high driving capability and can drive at high speed at the time of falling.

At time t5, the voltage of the output terminal OUT becomes lower than the second reference voltage V2, and the voltage VA becomes high level. Hence, the voltage VB of the positive input node of the comparison circuit 117 becomes the first reference voltage V1. At times t5 to t6, the comparison circuit 117 maintains the voltage VA at high level since the voltage of the output terminal OUT is lower than the second reference voltage V2. Hence, the second selector 114 connects the ground potential node to the gate of the n-channel field effect transistor 116, and the n-channel field effect transistor 116 becomes an off state. Hence, the undershoot 203 of FIG. 2A can be reduced.

As described above, at the time of rising of the voltage of the output terminal OUT, the comparison circuit 117 compares the first reference voltage V1 with the voltage of the output terminal OUT and, at the time of falling of the voltage of the output terminal OUT, compares the second reference voltage V2, which is different from the first reference voltage V1, with the voltage of the output terminal OUT. The second driver circuit 102 becomes an off state according to a comparison result of the comparison circuit 117.

The first selector 113, to which the output voltage VA of the comparison circuit 117 is inputted, at the time of rising of the voltage of the output terminal OUT connects the gate of the p-channel field effect transistor 115 to the input terminal IN when the voltage of the output terminal OUT is lower than the first reference voltage V1, and connects the gate of the p-channel field effect transistor 115 to the power supply potential node when the voltage of the output terminal OUT is higher than the first reference voltage V1.

Further, at the time of falling of the voltage of the output terminal OUT, the first selector 113 connects the gate of the p-channel field effect transistor 115 to the power supply potential node when the voltage of the output terminal OUT is higher than the second reference voltage V2, and connects the gate of the p-channel field effect transistor 115 to the input terminal IN when the voltage of the output terminal OUT is lower than the second reference voltage V2.

The second selector 114, to which the output voltage VA of the comparison circuit 117 is inputted, at the time of falling of the voltage of the output terminal OUT connects the gate of the n-channel field effect transistor 116 to the input terminal IN when the voltage of the output terminal OUT is higher than the second reference voltage V2, and connects the gate of the n-channel field effect transistor 116 to the ground potential node when the voltage of the output terminal OUT is lower than the second reference voltage V2.

Further, at the time of rising of the voltage of the output terminal OUT, the second selector 114 connects the gate of the n-channel field effect transistor 116 to the ground potential node when the voltage of the output terminal OUT is lower than the first reference voltage V1, and connects the gate of the n-channel field effect transistor 116 to the input terminal IN when the voltage of the output terminal OUT is higher than the first reference voltage V1.

By making the first reference voltage V1 higher than the second reference voltage V2, chattering can be prevented. When the second reference voltage V2 is the same as the first reference voltage V1, if vibrations of the overshoot 202 and the undershoot 203 of FIG. 2A occur, the value of the output voltage VA of the comparison circuit 117 changes repeatedly between "1" and "0" at high speed both at the time of rising and at the time of falling, making the operation unstable. By making the first reference voltage V1 higher than the second reference voltage V2, changes at high frequency of the output voltage VA of the comparison circuit 117 can be prevented, to thereby make the operation stable.

Further, by making the first reference voltage V1 higher than the second reference voltage V2, the p-channel field effect transistor 115 can support driving of the first driver circuit 101 in the long rising period of times t1 to t2. Further, by making the second reference voltage V2 lower than the first reference voltage V1, the n-channel field effect transistor 116 can support driving of the first driver circuit 101 in the long falling period of times t4 to t5.

Second Embodiment

FIG. 5 is a circuit diagram illustrating a configuration example of an output circuit according to a second embodiment. The output circuit has a first driver circuit 101, a second driver circuit 102a, a third driver circuit 102b, a fourth driver circuit 102c and comparison circuits 117ap, 117an, 117bp, 117bn, 117cp, 117cn.

The first driver circuit 101, to which the voltage of the input terminal IN is inputted, has a p-channel field effect transistor 111 and an n-channel field effect transistor 112, and outputs a voltage to the output terminal OUT.

The comparison circuit 117ap compares the first reference voltage V1 and the voltage of the output terminal OUT and outputs a voltage VAap. The comparison circuit 117an compares the first reference voltage V1 with the voltage of the output terminal OUT and outputs a voltage VAan. The voltage VAan is the same as the voltage VAap. The second driver circuit 102a, to which the voltage of the input terminal IN is inputted, outputs a voltage to the output terminal OUT, and becomes an off state according to comparison results of the comparison circuits 117ap and 117an.

The second driver circuit 102a has a p-channel field effect transistor 115a, an n-channel field effect transistor 116a, and selectors 113a and 114a. The p-channel field effect transistor 115a has a source connected to the power supply potential node, and a drain connected to the output terminal OUT. The n-channel field effect transistor 116a has a source connected to the ground potential node, and a drain connected to the output terminal OUT. The selector 113a, to which the output voltage VAap of the comparison circuit 117ap is inputted, connects the gate of the p-channel field effect transistor 115a to the input terminal IN when the voltage of the output terminal OUT is lower than the first reference voltage V1, and connects the gate of the p-channel field effect transistor 115a to the power supply potential node when the voltage of the output terminal OUT is higher than the first reference voltage V1. The selector 114a, to which the output voltage VAan of the comparison circuit 117an is inputted, connects the gate of the n-channel field effect transistor 116a to the input terminal IN when the voltage of the output terminal OUT is higher than the first reference voltage V1, and connects the gate of the n-channel field effect transistor 116a to the ground potential node when the voltage of the output terminal OUT is lower than the first reference voltage V1.

The comparison circuit 117bp compares the second reference voltage V2 which is different from the first reference voltage V1 with the voltage of the output terminal OUT, and outputs a voltage VAbp. The comparison circuit 117bn compares the second reference voltage V2 with the voltage of the output terminal OUT, and outputs a voltage VAbn. The voltage VAbn is the same as the voltage VAbp. The third driver circuit 102b, to which the voltage of the input terminal IN is inputted, outputs a voltage to the output terminal OUT, and becomes an off state according to comparison results of the comparison circuits 117bp and 117bn.

The third driver circuit 102b has a p-channel field effect transistor 115b, an n-channel field effect transistor 116b, and selectors 113b and 114b. The p-channel field effect transistor 115b has a source connected to the power supply potential node, and a drain connected to the output terminal OUT. The n-channel field effect transistor 116b has a source connected to the ground potential node, and a drain connected to the output terminal OUT. The selector 113b, to which the output voltage VAbp of the comparison circuit 117bp is inputted, connects the gate of the p-channel field effect transistor 115b to the input terminal IN when the voltage of the output terminal OUT is lower than the second reference voltage V2, and connects the gate of the p-channel field effect transistor 115b to the power supply potential node when the voltage of the output terminal OUT is higher than the second reference voltage V2. The selector 114b, to which the output voltage VAbn of the comparison circuit 117bn is inputted, connects the gate of the n-channel field effect transistor 116b to the input terminal IN when the voltage of the output terminal OUT is higher than the second reference voltage V2, and connects the gate of the n-channel field effect transistor 116b to the ground potential node when the voltage of the output terminal OUT is lower than the second reference voltage V2.

The comparison circuit 117cp compares a third reference voltage V3 which is different from the first reference voltage V1 and the second reference voltage V2 with the voltage of the output terminal OUT, and outputs a voltage VAcp. The comparison circuit 117cn compares the third reference voltage V3 with the voltage of the output terminal OUT, and outputs a voltage VAcn. The voltage VAcn is the same as the voltage VAcp. The fourth driver circuit 102c, to which the voltage of the input terminal IN is inputted, outputs a voltage to the output terminal OUT, and becomes an off state according to comparison results of the comparison circuits 117cp and 117cn.

The fourth driver circuit 102c has a p-channel field effect transistor 115c, an n-channel field effect transistor 116c, and selectors 113c and 114c. The p-channel field effect transistor 115c has a source connected to the power supply potential node, and a drain connected to the output terminal OUT. The n-channel field effect transistor 116c has a source connected to the ground potential node, and a drain connected to the output terminal OUT. The selector 113c, to which the output voltage VAcp of the comparison circuit 117cp is inputted, connects the gate of the p-channel field effect transistor 115c to the input terminal IN when the voltage of the output terminal OUT is lower than the third reference voltage V3, and connects the gate of the p-channel field effect transistor 115c to the power supply potential node when the voltage of the output terminal OUT is higher than the third reference voltage V3. The selector 114c, to which the output voltage VAcn of the comparison circuit 117cn is inputted, connects the gate of the n-channel field effect transistor 116c to the input terminal IN when the voltage of the output terminal OUT is higher than the third reference voltage V3, and connects the gate of the n-channel field effect transistor 116c to the ground potential node when the voltage of the output terminal OUT is lower than the third reference voltage V3.

FIG. 6A is a voltage waveform diagram for explaining operation of the output circuit of FIG. 5, and FIG. 6B is a voltage waveform diagram at the time of rising of the output terminal OUT after control of driving. The second reference voltage V2 is higher than the first reference voltage V1. The third reference voltage V3 is higher than the second reference voltage V2.

First, a period in which the voltage of the output terminal OUT rises from low level to high level will be explained. In a period Ta in which the voltage of the output terminal OUT is lower than the first reference voltage V1, the three p-channel field effect transistors 115a, 115b, 115c become an operating state, driving capability thereof becomes maximum, and driving speed can be made high. Next, in a period Tb in which the voltage of the output terminal OUT is higher than the first reference voltage V1 and lower than the second reference voltage V2, the two p-channel field effect transistors 115b, 115c become an operating state, the one p-channel field effect transistor 115a becomes an off state, and driving capability becomes weaker. Next, in a period Tc in which the voltage of the output terminal OUT is higher than the second reference voltage V2 and lower than the third reference voltage V3, the one p-channel field effect transistor 115c becomes an operating state, the two p-channel field effect transistors 115a, 115b become an off state, and driving capability becomes further weaker. Next, in a period Td in which the voltage of the output terminal OUT is higher than the third reference voltage V3, the three p-channel field effect transistors 115a, 115b, 115c become an off state, and driving capability becomes further weaker. At the time of rising, by the above-described control of driving of the p-channel field effect transistors 115a, 115b, 115c, the rising voltage of the output terminal OUT becomes gradually slow in rising speed as illustrated in FIG. 6B, and the overshoot 202 of FIG. 2A can be prevented.

Next, a period in which the voltage of the output terminal OUT falls from high level to low level will be explained. In a period in which the voltage of the output terminal OUT is lower than the third reference voltage V3, the three n-channel field effect transistors 116a, 116b, 116c become an operating state, driving capability thereof becomes maximum, and driving speed can be made high. Next, in a period in which the voltage of the output terminal OUT is lower than the third reference voltage V3 and higher than the second reference voltage V2, the two n-channel field effect transistors 116a, 116b become an operating state, the one n-channel field effect transistor 116c becomes an off state, and driving capability becomes weaker. Next, in a period in which the voltage of the output terminal OUT is lower than the second reference voltage V2 and higher than the first reference voltage V1, the one n-channel field effect transistor 116a becomes an operating state, the two n-channel field effect transistors 116b, 116c become an off state, and driving capability becomes further weaker. Next, in a period in which the voltage of the output terminal OUT is lower than the first reference voltage V1, the three n-channel field effect transistors 116a, 116b, 116c become an off state, and driving capability becomes further weaker. At the time of falling, by the above-described control of driving of the n-channel field effect transistors 116a, 116b, 116c, the falling voltage of the output terminal OUT becomes gradually slow in falling speed, and the undershoot 203 of FIG. 2A can be prevented.

Third Embodiment

FIG. 7 is a circuit diagram illustrating a configuration example of an output circuit according to a third embodiment. The output circuit of FIG. 7 is obtained by deleting the fourth driver circuit 102c and the comparison circuits 117cp, 117cn from the output circuit of FIG. 5 and adding a control circuit 501, a measurement circuit 502 and a selector 503 thereto. A comparison circuit 117a corresponds to the comparison circuits 117ap and 117an of FIG. 5, compares the voltage of the output terminal OUT and the first reference voltage V1, and outputs a voltage VAa to the selectors 113a and 114a. A comparison circuit 117b corresponds to the comparison circuits 117bp and 117bn of FIG. 5, compares the voltage of the output terminal OUT and the second reference voltage V2, and outputs a voltage VAb to the selectors 113b and 114b.

Hereinafter, differences of this embodiment (FIG. 7) from the second embodiment (FIG. 5) will be explained. The second driver circuit 102a has n n-channel field effect transistors 116a. The n n-channel field effect transistors 116a are connected in parallel, have a gate connected to an output node of the selector 114a, a source connected to the ground potential node, and a drain connected to the output terminal OUT. The control circuit 501 can control the number n of n-channel field effect transistors 116a connected in parallel between the output terminal OUT and the ground potential node, and can change the size of the n-channel field effect transistors 116a.

Similarly, the third driver circuit 102b has m p-channel field effect transistors 115b. The m p-channel field effect transistors 115b are connected in parallel, have a gate connected to an output node of the selector 113b, a source connected to the power supply potential node, and a drain connected to the output terminal OUT. The control circuit 501 can control the number m of p-channel field effect transistors 115b connected in parallel between the power supply potential node and the output terminal OUT, and can change the size of the p-channel field effect transistors 115b.

FIG. 8A is a circuit diagram illustrating a configuration example of the selector 503 of FIG. 7. The control circuit 501 sets "1" to a control signal SA when controlling the number m of parallel connections of the p-channel field effect transistors 115b, and sets "0" to the control signal SA when controlling the number n of parallel connections of the n-channel field effect transistors 116a. The selector 503 has inverters 601, 602 and selectors 603, 604. The inverter 601 outputs a logically inverted voltage /VAb of the output voltage VAb of the comparison circuit 117b. The inverter 602 outputs a logically inverted voltage /VAa of the output voltage VAa of the comparison circuit 117a. When the control signal SA is "1", the selector 603 outputs the voltage /VAb as a voltage P, and the selector 604 outputs the voltage /VAa as a voltage Q. When the control signal SA is "0", the selector 603 outputs the voltage VAa as the voltage P, and the selector 604 outputs the voltage VAb as the voltage Q.

FIGS. 8B and 8C are circuit diagrams illustrating configuration examples of the measurement circuit 502 of FIG. 7. A buffer 611, to which the voltage Q is inputted, outputs a voltage F1 to a capacitor 621 and a buffer 612. In a flip flop circuit 631, the voltage P is inputted to a data input terminal, and the voltage F1 is inputted to a clock input terminal. The buffer 612, to which the voltage F1 is inputted, outputs a voltage F2 to a capacitor 622 and a buffer 613. In a flip flop circuit 632, the voltage P is inputted to a data input terminal, and the voltage F2 is inputted to a clock input terminal. The buffer 613, to which the voltage F2 is inputted, outputs a voltage F3 to a capacitor 623 and a buffer 614. In a flip flop circuit 633, the voltage P is inputted to a data input terminal, and the voltage F3 is inputted to a clock input terminal. The buffer 614, to which the voltage F3 is inputted, outputs a voltage F4 to a capacitor 624 and a buffer 615. In a flip flop circuit 634, the voltage P is inputted to a data input terminal, and the voltage F4 is inputted to a clock input terminal. The buffer 615, to which the voltage F4 is inputted, outputs a voltage F5 to a capacitor 625. In a flip flop circuit 635, the voltage P is inputted to a data input terminal, and the voltage F5 is inputted to a clock input terminal.

When the control signal SA is "1", as illustrated in FIG. 8B, the voltage /VAa is inputted as the voltage Q to the buffer 611, and the voltage /VAb is inputted as the voltage P to the data input terminals of the flip flop circuits 631 to 635.

When the control signal SA is "0", as illustrated in FIG. 8C, the voltage VAb is inputted as the voltage Q to the buffer 611, and the voltage VAa is inputted as the voltage P to the data input terminals of the flip flop circuits 631 to 635.

Figure 9:
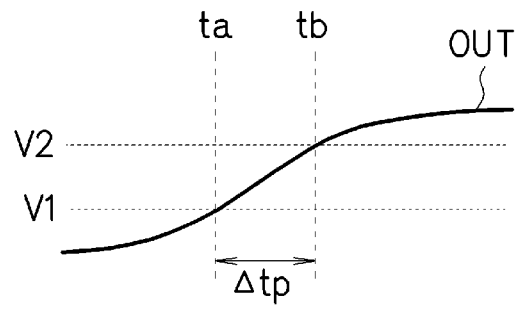
FIG. 9 is a diagram illustrating a voltage waveform at the time of rising of an output terminal.

FIG. 9 is a diagram illustrating a voltage waveform at the time of rising of the output terminal OUT. The second reference voltage V2 is higher than the first reference voltage V1. At time ta, the voltage of the output terminal OUT becomes higher than the first reference voltage V1, and the voltage VAa changes from a value "1" to a value "0". At time tb, the voltage of the output terminal OUT becomes higher than the second reference voltage V2, and the voltage VAb changes from a value "1" to a value "0". The measurement circuit 502 measures rising time Δtp from time ta to time tb. The control circuit 501 controls the number m of parallel connections of the p-channel field effect transistors 115b so that the rising time Δtp becomes a target time. When the number m of parallel connections is large, the size of the p-channel field effect transistors 115b is large, and the rising time Δtp becomes short, enabling high-speed driving. On the other hand, when the number m of parallel connections is small, the size of the p-channel field effect transistors 115b is small, and the rising time Δtp becomes long, enabling prevention of overshoot. By controlling the rising time Δtp to be the target time by the control circuit 501, both the high speed driving and the overshoot can be achieved together.

Figure 10:
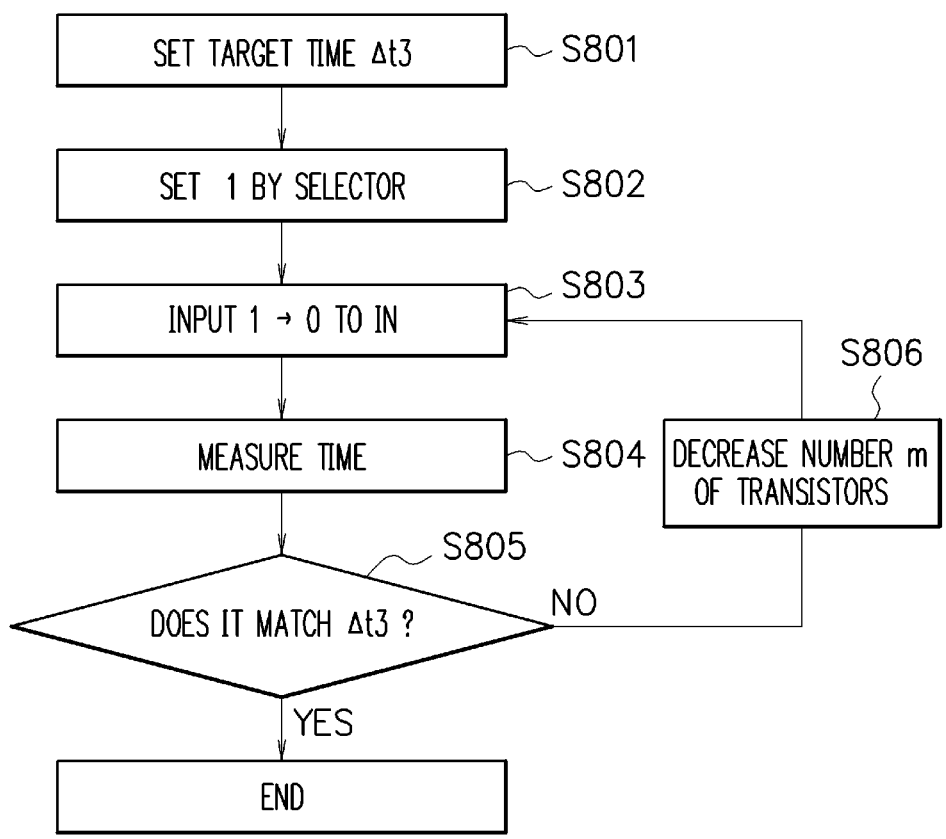
FIG. 10 is a flowchart illustrating a processing example in which the output circuit controls the number of parallel connections of p-channel field effect transistors.
Figure 11:
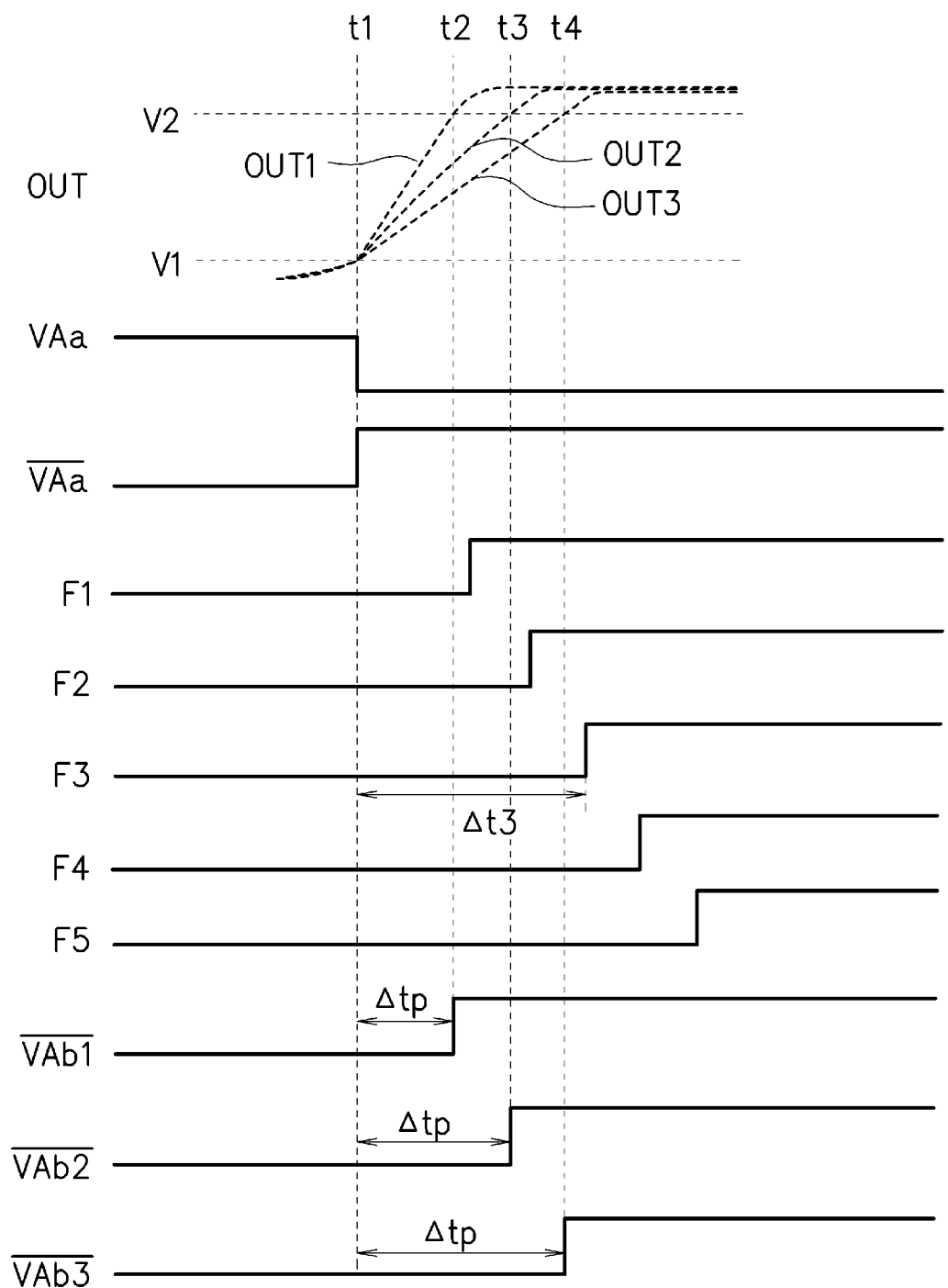
FIG. 11 is a timing chart illustrating a processing example of the output circuit.

FIG. 10 is a flowchart illustrating a processing example in which the output circuit controls the number m of parallel connections of the p-channel field effect transistors 115b, and FIG. 11 is a timing chart illustrating a processing example of the output circuit.

In step S801, the control circuit 501 sets, for example, time Δt3 as the target time of the rising time Δtp. The time Δt3 is from rising time t1 of the voltage /VAa to rising time of the voltage F3, as will be described later.

Next, in step S802, the control circuit 501 sets "1" to the control signal SA so as to control the number m of parallel connections of the p-channel field effect transistors 115b. Then, the selector 503 outputs the voltage /VAb as the voltage P, and outputs the voltage /VAa as the voltage Q. Further, the control circuit 501 controls the number m of parallel connections of the p-channel field effect transistors 115b to be the maximum value.

Next, in step S803, a voltage falling from a value "1" to a value "0" is inputted to the input terminal IN. Then, the first driver circuit 101 outputs a logically inverted voltage of the voltage of the input terminal IN to the output terminal OUT. The voltage of the output terminal OUT becomes a voltage rising from a value "0" to a value "1".

Here, a voltage OUT1 is the voltage of the output terminal OUT at a time of first loop processing of steps S803 to S805. A voltage OUT2 is the voltage of the output terminal OUT at a time of second loop processing of steps S803 to S805. A voltage OUT3 is the voltage of the output terminal OUT at a time of third loop processing of steps S803 to S805.

Further, a voltage /VAb1 is the voltage /VAb at a time of first loop processing of steps S803 to S805. A voltage /VAb2 is the voltage /VAb at a time of second loop processing of steps S803 to S805. A voltage /VAb3 is the voltage /VAb at a time of third loop processing of steps S803 to S805.

In the first loop processing, the voltage OUT1 and the voltage /VAb1 will be explained. At time t1, the voltage OUT1 becomes higher than the first reference voltage V1, and thus the voltage VAa falls from high level to low level, and the voltage /VAa rises from low level to high level. The voltage F1 is a delayed voltage of the voltage /VAa. The voltage F2 is a delayed voltage of the voltage F1. The voltage F3 is a delayed voltage of the voltage F2. The voltage F4 is a delayed voltage of the voltage F3. The voltage F5 is a delayed voltage of the voltage F4. At time t2, the voltage OUT1 becomes higher than the second reference voltage V2, and thus the voltage /VAb1 rises from low level to high level.

In step S804, the control circuit 501 measures the rising time Δtp from time t1 to time t2. The flip flop circuit 631 retains a value "1" of the voltage /VAb1 at the time of rising of the voltage F1. The flip flop circuit 632 retains a value "1" of the voltage /VAb1 at the time of rising of the voltage F2. The flip flop circuit 633 retains a value "1" of the voltage /VAb1 at the time of rising of the voltage F3. The flip flop circuit 634 retains a value "1" of the voltage /VAb1 at the time of rising of the voltage F4. The flip flop circuit 635 retains a value "1" of the voltage /VAb1 at the time of rising of the voltage F5.

In step S805, the control circuit 501 judges whether the rising time Δtp from time t1 to time t2 matches the target time Δt3 or not. Specifically, since the values retained in the flip flop circuits 631 to 635 are all "1", the control circuit 501 judges that the rising time Δtp from time t1 to time t2 is shorter than the target time Δt3, and proceeds to step S806.

In step S806, the control circuit 501 controls the number m of parallel connections of the p-channel field effect transistors 115b to decrease by 1. Thereafter, the control circuit 501 returns to step S803, and performs the second loop processing.

In step S803, the falling voltage is inputted again to the input terminal IN. In this case, the voltage of the output terminal OUT is the voltage OUT2, and the voltage /VAb is the voltage /VAb2. At time t1, the voltage OUT2 becomes higher than the first reference voltage V1, and thus the voltage VAa falls from high level to low level and the voltage /VAa rises from low level to high level. At time t3, the voltage OUT2 becomes higher than the second reference voltage V2, and thus the voltage /VAb2 rises from low level to high level.

In step S804, the control circuit 501 measures the rising time Δtp from time t1 to time t3. The flip flop circuits 631 to 635 each retain the value of the voltage /VAb2 at the time of rising of the voltages F1 to F5. The flip flop circuit 631 retains a value "0", and the flip flop circuits 632 to 635 retain a value "1".

In step S805, since the flip flop circuit 631 retains the value "0" and the flip flop circuits 632 to 635 retain the value "1", the control circuit 501 judges that the rising time Δtp from time t1 to time t3 is shorter than the target time Δt3, and proceeds to step S806.

In step S806, the control circuit 501 controls the number m of parallel connections of the p-channel field effect transistors 115b to further decrease by 1. Thereafter, the control circuit 501 returns to step S803, and performs the third loop processing.

In step S803, the falling voltage is inputted again to the input terminal IN. In this case, the voltage of the output terminal OUT is the voltage OUT3, and the voltage /VAb is the voltage /VAb3. At time t1, the voltage OUT3 becomes higher than the first reference voltage V1, and thus the voltage VAa falls from high level to low level and the voltage /VAa rises from low level to high level. At time t4, the voltage OUT3 becomes higher than the second reference voltage V2, and thus the voltage /VAb3 rises from low level to high level.

In step S804, the control circuit 501 measures the rising time Δtp from time t1 to time t4. The flip flop circuits 631 to 635 each retain the value of the voltage /VAb3 at the time of rising of the voltages F1 to F5. The flip flop circuits 631 and 632 retain a value "0", and the flip flop circuits 633 to 635 retain a value "1".

In step S805, since the flip flop circuits 631 and 632 retain the value "0" and the flip flop circuits 633 to 635 retain the value "1", the control circuit 501 judges that the rising time Δtp from time t1 to time t4 substantially matches the target time Δ t3, and finishes the processing.

By the above processing, the number m of parallel connections of the p-channel field effect transistors 115b is controlled so that the rising time Δtp substantially matches the target time Δt3, enabling to achieve both high-speed driving and prevention of overshoot. The control circuit 501 changes the size of the p-channel field effect transistors 115b according to the rising time Δtp from the time when the output voltage VAa of the comparison circuit 117a is inverted to the time when the output voltage VAb of the comparison circuit 117b is inverted.

Figure 13:
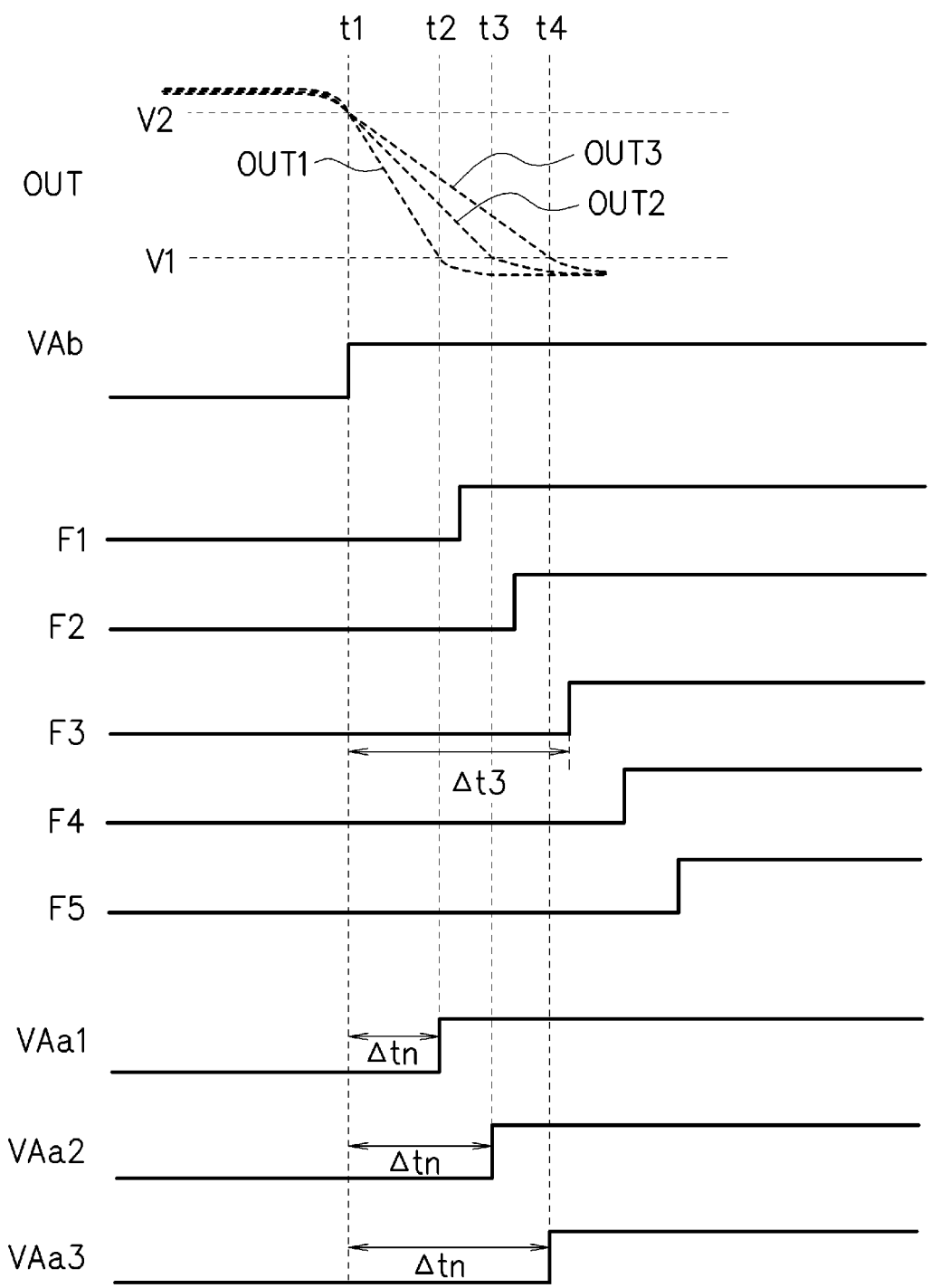
FIG. 13 is a timing chart illustrating a processing example of the output circuit.

FIG. 12 is a flowchart illustrating a processing example in which the output circuit controls the number n of parallel connections of the n-channel field effect transistors 116a, and FIG. 13 is a timing chart illustrating a processing example of the output circuit.

In step S1001, the control circuit 501 sets, for example, time Δt3 as the target time of falling time Δtn.

Next, in step S1002, the control circuit 501 sets "0" to the control signal SA so as to control the number n of parallel connections of the n-channel field effect transistors 116a. Then, the selector 503 outputs the voltage VAa as the voltage P, and outputs the voltage VAb as the voltage Q. Further, the control circuit 501 controls the number n of parallel connections of the n-channel field effect transistors 116a to be the maximum value.

Next, in step S1003, a voltage rising from a value "0" to a value "1" is inputted to the input terminal IN. Then, the first driver circuit 101 outputs a logically inverted voltage of the voltage of the input terminal IN to the output terminal OUT. The voltage of the output terminal OUT becomes a voltage falling from a value "1" to a value "0".

In the first loop processing, the voltage of the output terminal OUT is the voltage VOUT1, and the voltage VAa is a voltage VAa1. At time t1, the voltage OUT1 becomes lower than the second reference voltage V2, and thus the voltage VAb rises from low level to high level. The voltage F1 is a delayed voltage of the voltage VAb. The voltage F2 is a delayed voltage of the voltage F1. The voltage F3 is a delayed voltage of the voltage F2. The voltage F4 is a delayed voltage of the voltage F3. The voltage F5 is a delayed voltage of the voltage F4. At time L2, the voltage OUT1 becomes lower than the first reference voltage V1, and thus the voltage VAa1 rises from low level to high level.

In step S1004, the control circuit 501 measures the falling time Δtn from time t1 to time t2. The flip flop circuits 631 to 635 each retain the value of the voltage VAa1 at the time of rising of the voltages F1 to F5. The flip flop circuits 631 to 635 all retain a value "1".

In step S1005, the control circuit 501 judges whether the falling time Δtn from time t1 to time t2 matches the target time Δt3 or not. Specifically, since the values retained in the flip flop circuits 631 to 635 are all "1", the control circuit 501 judges that the falling time Δtn from time t1 to time t2 is shorter than the target time Δ t3, and proceeds to step S1006.

In step S1006, the control circuit 501 controls the number n of parallel connections of the n-channel field effect transistors 116a to decrease by 1. Thereafter, the control circuit 501 returns to step S1003, and performs the second loop processing.

In step S1003, the rising voltage is inputted again to the input terminal IN. In this case, the voltage of the output terminal OUT is the voltage OUT2, and the voltage VAa is a voltage VAa2. At time t1, the voltage OUT2 becomes lower than the second reference voltage V2, and thus the voltage VAb rises from low level to high level. At time t3, the voltage OUT2 becomes lower than the first reference voltage V1, and thus the voltage VAa2 rises from low level to high level.

In step S1004, the control circuit 501 measures the falling time Δtn from time t1 to time t3. The flip flop circuits 631 to 635 each retain the value of the voltage VAa2 at the time of rising of the voltages F1 to F5. The flip flop circuit 631 retains a value "0", and the flip flop circuits 632 to 635 retain a value "1".

In step S1005, since the flip flop circuit 631 retains the value "0" and the flip flop circuits 632 to 635 retain the value "1", the control circuit 501 judges that the falling time Δtn from time t1 to time t3 is shorter than the target time Δt3, and proceeds to step S1006.

In step S1006, the control circuit 501 controls the number n of parallel connections of the n-channel field effect transistors 116a to further decrease by 1. Thereafter, the control circuit 501 returns to step S1003, and performs the third loop processing.

In step S1003, the rising voltage is inputted again to the input terminal IN. In this case, the voltage of the output terminal OUT is the voltage OUT3, and the voltage VAa is a voltage VAa3. At time t1, the voltage OUT3 becomes lower than the second reference voltage V2, and thus the voltage VAb rises from low level to high level. At time t4, the voltage OUT3 becomes lower than the first reference voltage V1, and thus the voltage VAa3 rises from low level to high level.

In step S1004, the control circuit 501 measures the falling time Δtn from time t1 to time t4. The flip flop circuits 631 to 635 each retain the value of the voltage VAa3 at the time of rising of the voltages F1 to F5. The flip flop circuits 631 and 632 retain a value "0", and the flip flop circuits 633 to 635 retain a value "1".

In step S1005, since the flip flop circuits 631 and 632 retain the value "0" and the flip flop circuits 633 to 635 retain the value "1", the control circuit 501 judges that the falling time Δtn from time t1 to time t4 substantially matches the target time Δt3, and finishes the processing.

By the above processing, the number n of parallel connections of the n-channel field effect transistors 116a is controlled so that the falling time Δtn substantially matches the target time Δt3, enabling to achieve both high-speed driving and prevention of undershoot. The control circuit 501 changes the size of the n-channel field effect transistors 116a according to the falling time Δtn from the time when the output voltage VAb of the comparison circuit 117b is inverted to the time when the output voltage VAa of the comparison circuit 117a is inverted.

Fourth Embodiment

Figure 14:
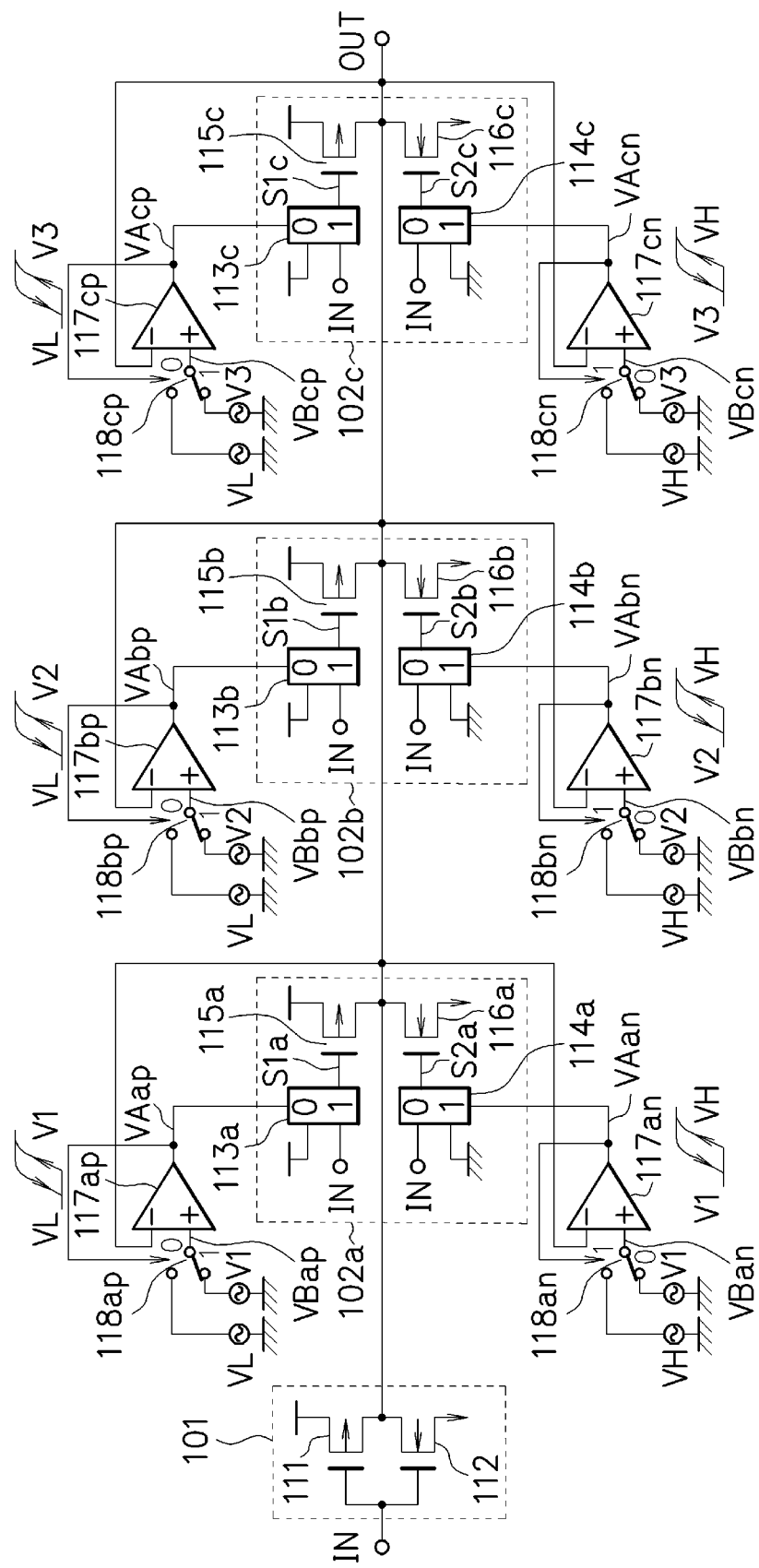
FIG. 14 is a circuit diagram illustrating a configuration example of an output circuit according to a fourth embodiment.

FIG. 14 is a circuit diagram illustrating a configuration example of an output circuit according to a fourth embodiment. The output circuit of FIG. 14 is obtained by adding switches 118ap, 118an, 118bp, 118bn, 118cp, 118cn to the output circuit of FIG. 5. Hereinafter, differences of this embodiment (FIG. 14) from the second embodiment (FIG. 5) will be explained.

The switch 118ap outputs the first reference voltage V1 as a voltage VBap to a positive input node of the comparison circuit 117ap when the voltage VAap has a value "1", and outputs a reference voltage VL as the voltage VBap to the positive input node of the comparison circuit 117ap when the voltage VAap has a value "0".

The switch 118an outputs the first reference voltage V1 as a voltage VBan to a positive input node of the comparison circuit 117an when the voltage VAan has a value "0", and outputs a reference voltage VH as the voltage VBan to the positive input node of the comparison circuit 117an when the voltage VAan has a value "1".

The switch 118bp outputs the second reference voltage V2 as a voltage VBbp to a positive input node of the comparison circuit 117bp when the voltage VAbp has a value "1", and outputs the reference voltage VL as the voltage VBbp to the positive input node of the comparison circuit 117bp when the voltage VAbp has a value "0".

The switch 118bn outputs the second reference voltage V2 as a voltage VBbn to a positive input node of the comparison circuit 117bn when the voltage VAbn has a value "0", and outputs the reference voltage VH as the voltage VBbn to the positive input node of the comparison circuit 117bn when the voltage VAbn has a value "1".

The switch 118cp outputs the third reference voltage V3 as a voltage VBcp to a positive input node of the comparison circuit 117cp when the voltage VAcp has a value "1", and outputs the reference voltage VL as the voltage VBcp to the positive input node of the comparison circuit 117cp when the voltage VAcp has a value "0".

The switch 118cn outputs the third reference voltage V3 as a voltage VBcn to a positive input node of the comparison circuit 117cn when the voltage VAcn has a value "0", and outputs the reference voltage VH as the voltage VBcn to the positive input node of the comparison circuit 117cn when the voltage VAcn has a value "1".

Figure 15:
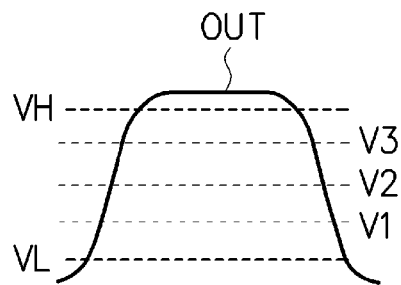
FIG. 15 is a voltage waveform diagram of an output terminal.

FIG. 15 is a voltage waveform diagram of the output terminal OUT. The first reference voltage V1 is 0.9 V for example. The second reference voltage V2 is higher than the first reference voltage V1 and is 1.65 V for example. The third reference voltage V3 is higher than the second reference voltage V2 and is 2.4 V for example. The reference voltage VH is higher than the third reference voltage V3 and is 3.1 V for example. The reference voltage VL is lower than the first reference voltage V1 and is 0.2 V for example. The power supply voltage is 3.3 V for example.

Figure 16:
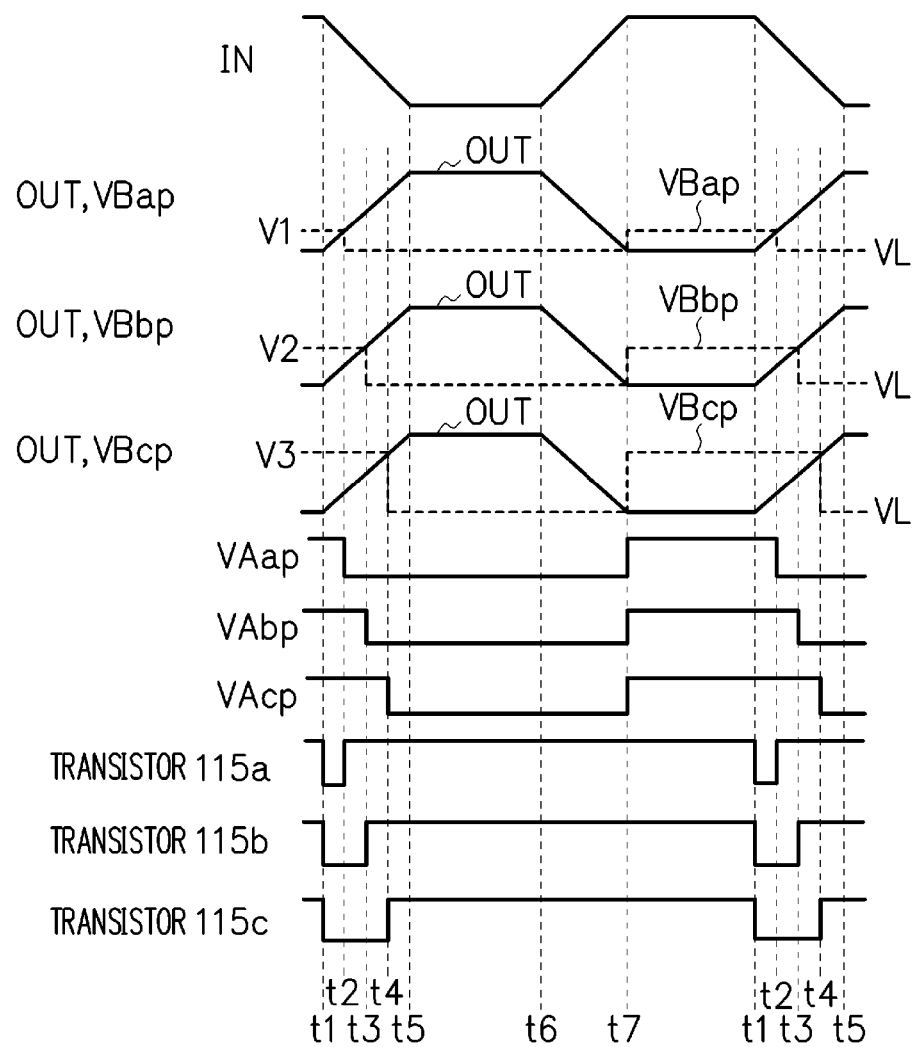
FIG. 16 is a timing chart for explaining operation of p-channel field effect transistors.

FIG. 16 is a timing chart for explaining operation of the p-channel field effect transistors 115a, 115b, 115c. In FIG. 16, low level of the p-channel field effect transistors 115a, 115b, 115c represents an operating state, and high level thereof represents a non-operating state (off state). The first driver circuit 101 outputs a logically inverted voltage of the voltage of the input terminal IN to the output terminal OUT.

Times t1 to t5 are a period in which the voltage of the output terminal OUT rises from low level to high level. At time t1, the voltage of the output terminal OUT is at low level. The voltages VAap, VAbp, VAcp are at high level, and thus the voltage VBap becomes the first reference voltage V1, the voltage VBbp becomes the second reference voltage V2, and the voltage VBcp becomes the third reference voltage V3. In this case, the selectors 113a, 113b, 113c connect the input terminal IN to the gates of the p-channel field effect transistors 115a, 115b, 115c, respectively. At this time, the voltage of the input terminal IN is at high level, and thus the p-channel field effect transistors 115a, 115b, 115c are in an off state.

Next, at time t1 to t2, the voltage of the output terminal OUT is lower than the first reference voltage V1, and thus the voltages VAap, VAbp, VAcp maintain high level. After time t1, the voltage of the input terminal IN becomes lower than high level, and thus the p-channel field effect transistors 115a, 115b, 115c becomes an operating state. Hence, the output circuit has high driving capability and can drive at high speed at the time of rising of the output terminal OUT.

At time t2, the voltage of the output terminal OUT becomes higher than the first reference voltage V1, and the voltage VAap becomes low level. Hence, the voltage VBap of the positive input node of the comparison circuit 117*ap* becomes the reference voltage VL. At times t2 to t7, the voltage of the output terminal OUT is higher than the reference voltage VL, and thus the comparison circuit 117*ap* maintains the voltage VAap at low level. Hence, the selector 113*a* connects the power supply potential node to the gate of the p-channel field effect transistor 115*a*, and the p-channel field effect transistor 115*a* becomes an off state. Hence, the overshoot 202 of FIG. 2A can be reduced.

At time t3, the voltage of the output terminal OUT becomes higher than the second reference voltage V2, and the voltage VAbp becomes low level. Hence, the voltage VBbp of the positive input node of the comparison circuit 117*bp* becomes the reference voltage VL. At times t3 to t7, the voltage of the output terminal OUT is higher than the reference voltage VL, and thus the comparison circuit 117*bp* maintains the voltage VAbp at low level. Hence, the selector 113*b* connects the power supply potential node to the gate of the p-channel field effect transistor 115*b*, and the p-channel field effect transistor 115*b* becomes an off state. Hence, the overshoot 202 of FIG. 2A can be reduced.

At time t4, the voltage of the output terminal OUT becomes higher than the third reference voltage V3, and the voltage VAcp becomes low level. Hence, the voltage VBcp of the positive input node of the comparison circuit 117*cp* becomes the reference voltage VL. At times t4 to t7, the voltage of the output terminal OUT is higher than the reference voltage VL, and thus the comparison circuit 117*cp* maintains the voltage VAcp at low level. Hence, the selector 113*c* connects the power supply potential node to the gate of the p-channel field effect transistor 115*c*, and the p-channel field effect transistor 115*c* becomes an off state. Hence, the overshoot 202 of FIG. 2A can be reduced.

As described above, the operating period of the p-channel field effect transistor 115*a* is the period from time t1 to time t2. The operating period of the p-channel field effect transistor 115*b* is the period from time t1 to time t3. The operating period of the p-channel field effect transistor 115*c* is the period from time t1 to time t4.

Figure 17:
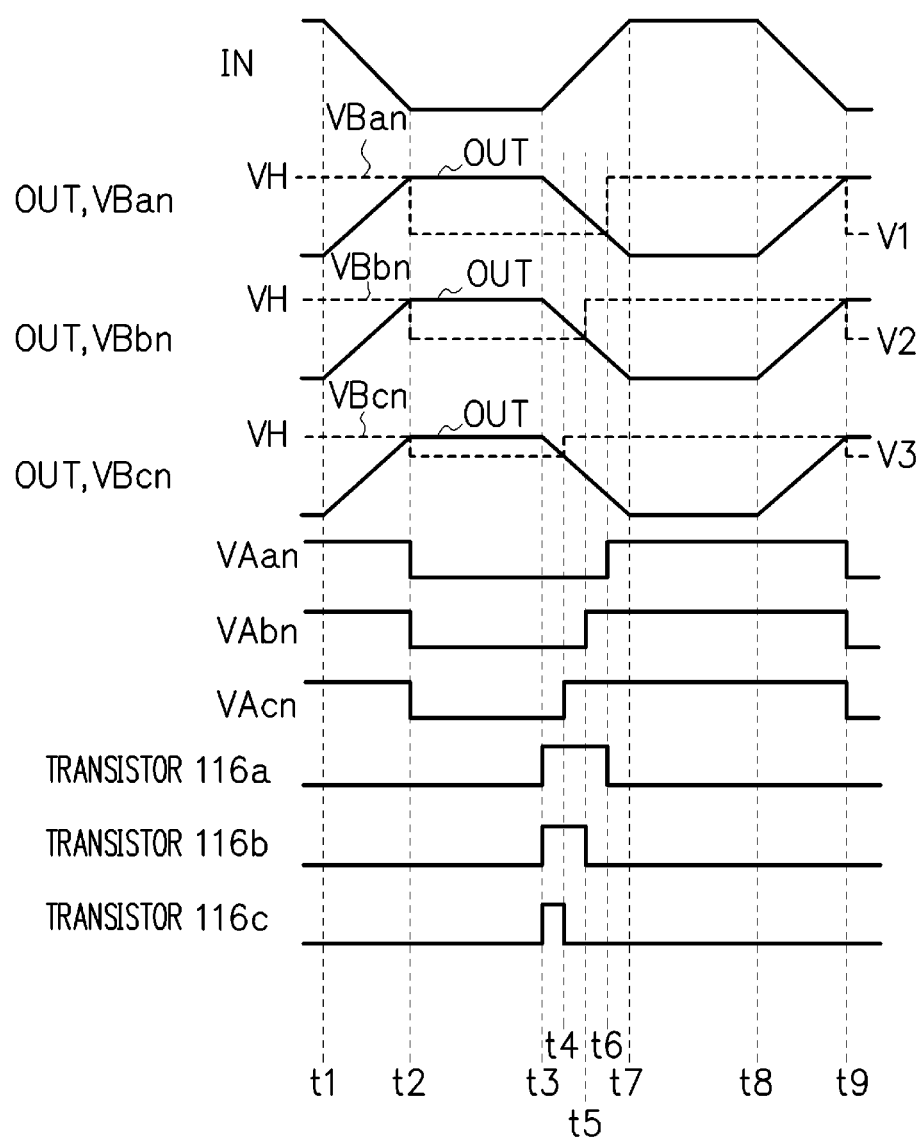
FIG. 17 is a timing chart for explaining operation of n-channel field effect transistors.

FIG. 17 is a timing chart for explaining operation of the n-channel field effect transistors 116*a*, 116*b*, 116*c*. In FIG. 17, high level of the n-channel field effect transistors 116*a*, 116*b*, 116*c* represents an operating state, and low level thereof represents a non-operating state (off state). The first driver circuit 101 outputs a logically inverted voltage of the voltage of the input terminal IN to the output terminal OUT.

Times t1 to t2 are a period in which the voltage of the output terminal OUT rises from low level to high level. At time t1, the voltage of the output terminal OUT is at low level. The voltages VAan, VAbn, VAcn are at high level, and thus the voltages VBan, VBbn, VBcn become the reference voltage VH. In this case, the selectors 114*a*, 114*b*, 114*c* connect the ground potential node to the gates of the n-channel field effect transistors 116*a*, 116*b*, 116*c*, respectively. The n-channel field effect transistors 116*a*, 116*b*, 116*c* are in an off state.

At time t2, the voltage of the output terminal OUT becomes higher than the reference voltage VH, and the voltages VAan, VAbn, VAcn becomes low level. Hence, the voltage VBan of the positive input node of the comparison circuit 117*an* becomes the first reference voltage V1, the voltage VBbn of the positive input node of the comparison circuit 117*bn* becomes second reference voltage V2, and the voltage VBcn of the positive input node of the comparison circuit 117*cn* becomes third reference voltage V3. At times t2 to t3, the selectors 114*a*, 114*b*, 114*c* connect the input terminal IN to the gates of the n-channel field effect transistors 116*a*, 116*b*, 116*c*. At this time, the voltage of the input terminal IN is at low level, and thus the n-channel field effect transistors 116*a*, 116*b*, 116*c* are in an off state.

Times t3 to t7 are a period in which the voltage of the output terminal OUT falls from high level to low level. After time t3, the voltage of the input terminal IN becomes higher than low level, and thus the n-channel field effect transistors 116*a*, 116*b*, 116*c* become an operating state. Hence, the output circuit has high driving capability and can drive at high speed at the time of falling of the output terminal OUT.

At time t4, the voltage of the output terminal OUT becomes lower than the third reference voltage V3, and the voltage VAcn becomes high level. Hence, the voltage VBcn of the positive input node of the comparison circuit 117*cn* becomes the reference voltage VH. At times t4 to t9, the voltage of the output terminal OUT is lower than the reference voltage VH, and thus the comparison circuit 117*cn* maintains the voltage VAcn at high level. Hence, the selector 114*c* connects the ground potential node to the gate of the n-channel field effect transistor 116*c*, and the n-channel field effect transistor 116*c* becomes an off state. Hence, the undershoot 203 of FIG. 2A can be reduced.

At time t5, the voltage of the output terminal OUT becomes lower than the second reference voltage V2, and the voltage VAbn becomes high level. Hence, the voltage VBbn of the positive input node of the comparison circuit 117*bn* becomes the reference voltage VH. At times t5 to t9, the voltage of the output terminal OUT is lower than the reference voltage VH, and thus the comparison circuit 117*bn* maintains the voltage VAbn at high level. Hence, the selector 114*b* connects the ground potential node to the gate of the n-channel field effect transistor 116*b*, and the n-channel field effect transistor 116*b* becomes an off state. Hence, the undershoot 203 of FIG. 2A can be reduced.

At time t6, the voltage of the output terminal OUT becomes lower than the first reference voltage V1, and the voltage VAan becomes high level. Hence, the voltage VBan of the positive input node of the comparison circuit 117*an* becomes the reference voltage VH. At times t6 to t9, the voltage of the output terminal OUT is lower than the reference voltage VH, and thus the comparison circuit 117*an* maintains the voltage VAan at high level. Hence, the selector 114*a* connects the ground potential node to the gate of the n-channel field effect transistor 116*a*, and the n-channel field effect transistor 116*a* becomes an off state. Hence, the undershoot 203 of FIG. 2A can be reduced.

As described above, the operating period of the n-channel field effect transistor 116*a* is the period from time t3 to time t6. The operating period of the n-channel field effect transistor 116*b* is the period from time t3 to time t5. The operating period of the n-channel field effect transistor 116*c* is the period from time t3 to time t4.

As illustrated in FIG. 17, at the rising time of the voltage of the output terminal OUT, the voltages VBan, VBbn, VBcn are the reference voltage VH, and thus the n-channel field effect transistors 116*a*, 116*b*, 116*c* become an off state. Hence, as illustrated in FIG. 16, at the rising time of the voltage of the output terminal OUT, the voltage of the output terminal OUT can be made to rise efficiently by operation of the p-channel field effect transistors 115*a*, 115*b*, 115*c*.

Further, as illustrated in FIG. 16, at the falling time of the voltage of the output terminal OUT, the voltages VBap, VBbp, VBcp are the reference voltage VL, and thus the p-channel field effect transistors 115*a*, 115*b*, 115*c* become an off state. Hence, as illustrated in FIG. 17, at the falling time of the voltage of the output terminal OUT, the voltage of the output terminal OUT can be made to fall efficiently by operation of the n-channel field effect transistors 116a, 116b, 116c.

As described above, the comparison circuit 117ap compares the voltage of the output terminal OUT with the first reference voltage V1 at the time of rising of the voltage of the output terminal OUT, and compares the voltage of the output terminal OUT with the reference voltage VL at the time of falling of the voltage of the output terminal OUT. The comparison circuit 117an compares the voltage of the output terminal OUT with the first reference voltage V1 when the voltage of the output terminal OUT falls, and compares the voltage of the output terminal OUT with the reference voltage VH when the voltage of the output terminal OUT rises.

The comparison circuit 117bp compares the voltage of the output terminal OUT with the second reference voltage V2 at the time of rising of the voltage of the output terminal OUT, and compares the voltage of the output terminal OUT with the reference voltage VL at the time of falling of the voltage of the output terminal OUT. The comparison circuit 117bn compares the voltage of the output terminal OUT with the second reference voltage V2 when the voltage of the output terminal OUT falls, and compares the voltage of the output terminal OUT with the reference voltage VH when the voltage of the output terminal OUT rises.

The comparison circuit 117cp compares the voltage of the output terminal OUT with the third reference voltage V3 at the time of rising of the voltage of the output terminal OUT, and compares the voltage of the output terminal OUT with the reference voltage VL at the time of falling of the voltage of the output terminal OUT. The comparison circuit 117cn compares the voltage of the output terminal OUT with the third reference voltage V3 when the voltage of the output terminal OUT falls, and compares the voltage of the output terminal OUT with the reference voltage VH when the voltage of the output terminal OUT rises.

The selector 113a, to which the output voltage VAap of the comparison circuit 117ap is inputted, at the time of rising of the voltage of the output terminal OUT connects the gate of the p-channel field effect transistor 115a to the input terminal IN when the voltage of the output terminal OUT is lower than the first reference voltage V1, and connects the gate of the p-channel field effect transistor 115a to the power supply potential node when the voltage of the output terminal OUT is higher than the first reference voltage V1.

Further, at the time of falling of the voltage of the output terminal OUT, the selector 113a connects the gate of the p-channel field effect transistor 115a to the power supply potential node when the voltage of the output terminal OUT is higher than the reference voltage VL, and connects the gate of the p-channel field effect transistor 115a to the input terminal IN when the voltage of the output terminal OUT is lower than the reference voltage VL.

The selector 114a, to which the output voltage VAan of the comparison circuit 117an is inputted, at the time of falling of the voltage of the output terminal OUT connects the gate of the n-channel field effect transistor 116a to the input terminal IN when the voltage of the output terminal OUT is higher than the first reference voltage V1, and connects the gate of the n-channel field effect transistor 116a to the ground potential node when the voltage of the output terminal OUT is lower than the first reference voltage V1.

Further, at the time of rising of the voltage of the output terminal OUT, the selector 114a connects the gate of the n-channel field effect transistor 116a to the ground potential node when the voltage of the output terminal OUT is lower than the reference voltage VH, and connects the gate of the n-channel field effect transistor 116a to the input terminal IN when the voltage of the output terminal OUT is higher than the reference voltage VH.

The selector 113b, to which the output voltage VAbp of the comparison circuit 117bp is inputted, at the time of rising of the voltage of the output terminal OUT connects the gate of the p-channel field effect transistor 115b to the input terminal IN when the voltage of the output terminal OUT is lower than the second reference voltage V2, and connects the gate of the p-channel field effect transistor 115b to the power supply potential node when the voltage of the output terminal OUT is higher than the second reference voltage V2.

Further, at the time of falling of the voltage of the output terminal OUT, the selector 113b connects the gate of the p-channel field effect transistor 115b to the power supply potential node when the voltage of the output terminal OUT is higher than the reference voltage VL, and connects the gate of the p-channel field effect transistor 115b to the input terminal IN when the voltage of the output terminal OUT is lower than the reference voltage VL.

The selector 114b, to which the output voltage VAbn of the comparison circuit 117bn is inputted, at the time of falling of the voltage of the output terminal OUT connects the gate of the n-channel field effect transistor 116b to the input terminal IN when the voltage of the output terminal OUT is higher than the second reference voltage V2, and connects the gate of the n-channel field effect transistor 116b to the ground potential node when the voltage of the output terminal OUT is lower than the second reference voltage V2.

Further, at the time of rising of the voltage of the output terminal OUT, the selector 114b connects the gate of the n-channel field effect transistor 116b to the ground potential node when the voltage of the output terminal OUT is lower than the reference voltage VH, and connects the gate of the n-channel field effect transistor 116b to the input terminal IN when the voltage of the output terminal OUT is higher than the reference voltage VH.

The selector 113c, to which the output voltage VAcp of the comparison circuit 117cp is inputted, at the time of rising of the voltage of the output terminal OUT connects the gate of the p-channel field effect transistor 115c to the input terminal TN when the voltage of the output terminal OUT is lower than the third reference voltage V3, and connects the gate of the p-channel field effect transistor 115c to the power supply potential node when the voltage of the output terminal OUT is higher than the third reference voltage V3.

Further, at the time of falling of the voltage of the output terminal OUT, the selector 113c connects the gate of the p-channel field effect transistor 115c to the power supply potential node when the voltage of the output terminal OUT is higher than the reference voltage VL, and connects the gate of the p-channel field effect transistor 115c to the input terminal IN when the voltage of the output terminal OUT is lower than the reference voltage VL.

The selector 114c, to which the output voltage VAcn of the comparison circuit 117cn is inputted, at the time of falling of the voltage of the output terminal OUT connects the gate of the n-channel field effect transistor 116c to the input terminal IN when the voltage of the output terminal OUT is higher than the third reference voltage V3, and connects the gate of the n-channel field effect transistor 116c to the ground potential node when the voltage of the output terminal OUT is lower than the third reference voltage V3.

Further, at the time of rising of the voltage of the output terminal OUT, the selector 114c connects the gate of the n-channel field effect transistor 116c to the ground potential node when the voltage of the output terminal OUT is lower than the reference voltage VH, and connects the gate of the n-channel field effect transistor 116c to the input terminal IN when the voltage of the output terminal OUT is higher than the reference voltage VH.

Fifth Embodiment

Figure 18:
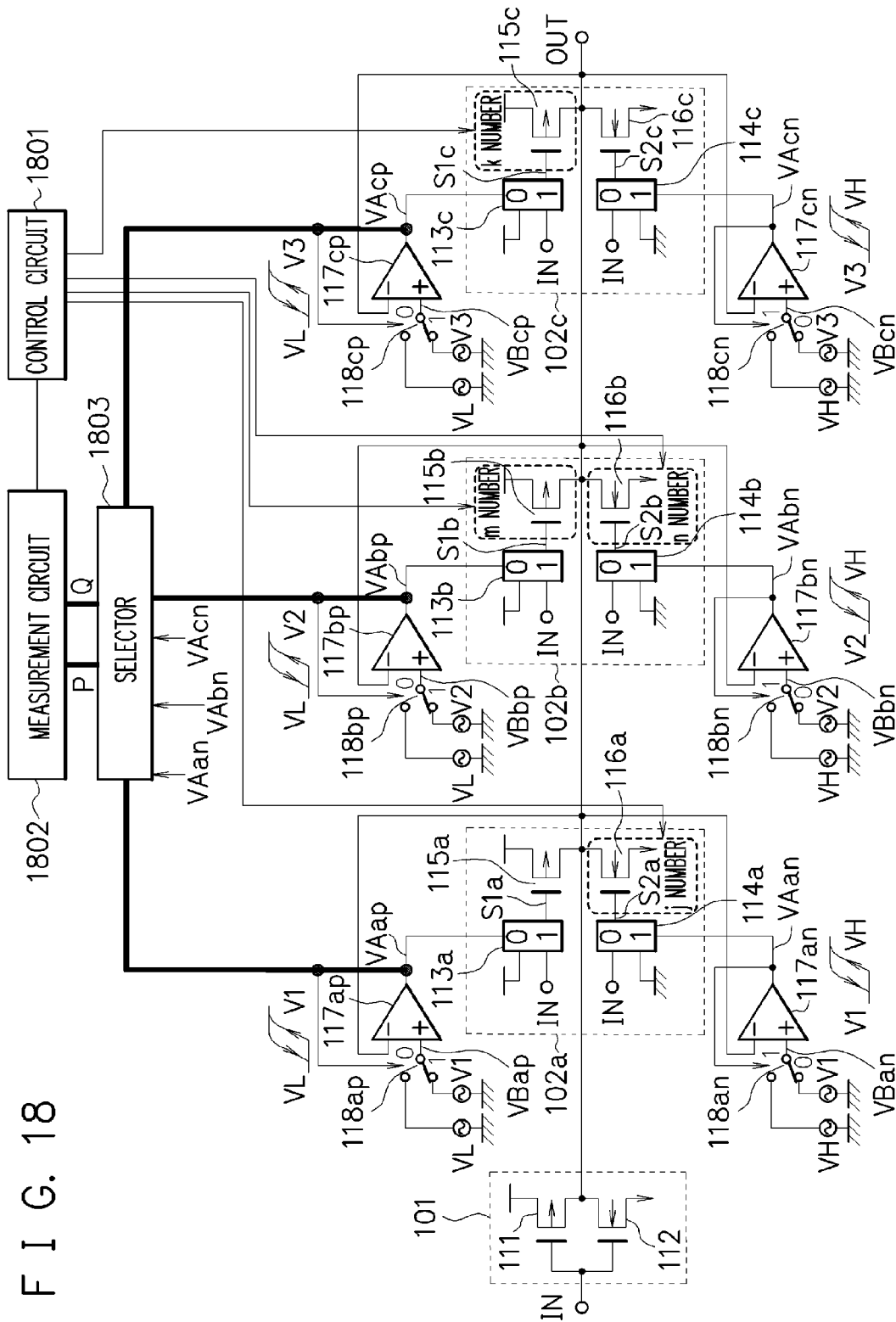
FIG. 18 is a circuit diagram illustrating a configuration example of an output circuit according to a fifth embodiment.

FIG. 18 is a circuit diagram illustrating a configuration example of an output circuit according to a fifth embodiment. The output circuit of FIG. 18 is obtained by adding a control circuit 1801, a measurement circuit 1802 and a selector 1803 to the output circuit of FIG. 14. Hereinafter, differences of this embodiment (FIG. 18) from the fourth embodiment (FIG. 14) will be explained.

The second driver circuit 102a has j n-channel field effect transistors 116a. The j n-channel field effect transistors 116a are connected in parallel, have a gate connected to an output node of the selector 114a, a source connected to the ground potential node, and a drain connected to the output terminal OUT. The control circuit 1801 can control the number j of n-channel field effect transistors 116a connected in parallel between the output terminal OUT and the ground potential node, and can change the size of the n-channel field effect transistors 116a.

Similarly, the third driver circuit 102b has m p-channel field effect transistors 115b. The m p-channel field effect transistors 115b are connected in parallel, have a gate connected to an output node of the selector 113b, a source connected to the power supply potential node, and a drain connected to the output terminal OUT. The control circuit 1801 can control the number m of p-channel field effect transistors 115b connected in parallel between the power supply potential node and the output terminal OUT, and can change the size of the p-channel field effect transistors 115b.

Further, the third driver circuit 102b has n n-channel field effect transistors 116b. The n n-channel field effect transistors 116b are connected in parallel, have a gate connected to an output node of the selector 114b, a source connected to the ground potential node, and a drain connected to the output terminal OUT. The control circuit 1801 can control the number n of n-channel field effect transistors 116b connected in parallel between the ground potential node and the output terminal OUT, and can change the size of the n-channel field effect transistors 116b.

Similarly, the fourth driver circuit 102c has k p-channel field effect transistors 115c. The k p-channel field effect transistors 115c are connected in parallel, have a gate connected to an output node of the selector 113c, a source connected to the power supply potential node, and a drain connected to the output terminal OUT. The control circuit 1801 can control the number k of p-channel field effect transistors 115c connected in parallel between the power supply potential node and the output terminal OUT, and can change the size of the p-channel field effect transistors 115c.

Figure 19A:
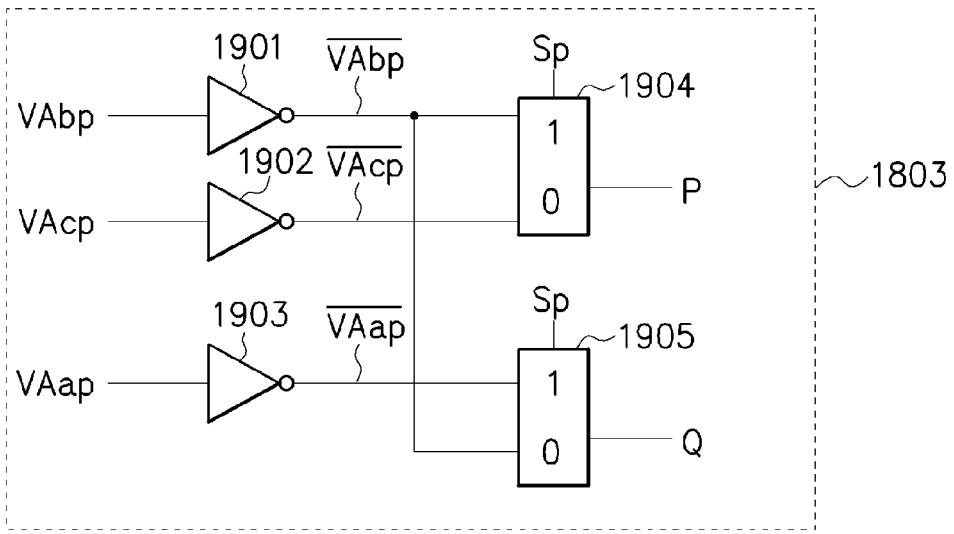
FIG. 19A is a circuit diagram illustrating a configuration example of a part of a selector of FIG. 18.

FIG. 19A is a circuit diagram illustrating a configuration example of a part of the selector 1803 of FIG. 18. The control circuit 1801 sets "1" to a control signal Sp when controlling the number m of parallel connections of the p-channel field effect transistors 115b, and sets "0" to the control signal Sp when controlling the number k of parallel connections of the p-channel field effect transistors 115c. The selector 1803 has inverters 1901, 1902, 1903 and selectors 1904, 1905. The inverter 1901 outputs a logically inverted voltage /VAbp of the output voltage VAbp of the comparison circuit 117bp. The inverter 1902 outputs a logically inverted voltage /VAcp of the output voltage VAcp of the comparison circuit 117cp. The inverter 1903 outputs a logically inverted voltage /VAap of the output voltage VAap of the comparison circuit 117ap. When the control signal Sp is "1", the selector 1904 outputs the voltage /VAbp as a voltage P, and the selector 1905 outputs the voltage /VAap as a voltage Q. When the control signal. Sp is "0", the selector 1904 outputs the voltage /VAcp as the voltage P, and the selector 1905 outputs the voltage /VAbp as the voltage Q.

Figure 19B:
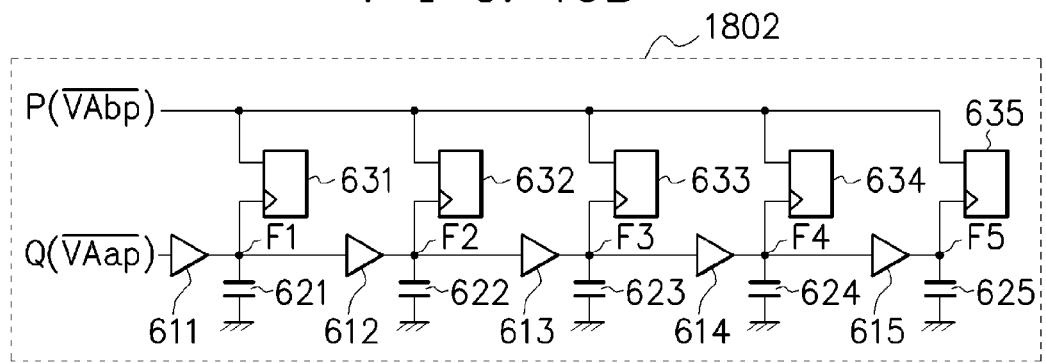
FIGS. 19B and 19C are circuit diagrams illustrating configuration examples of a measurement circuit of FIG. 18.
Figure 19C:
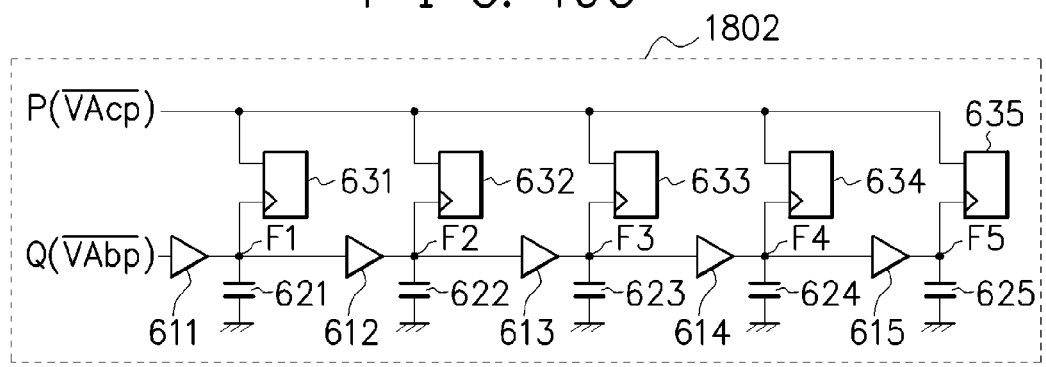

FIGS. 19B and 19C are circuit diagrams illustrating configuration examples of the measurement circuit 1802 of FIG. 18. Similarly to the measurement circuit 502 of FIGS. 8B and 8C, the measurement circuit 1802 has buffers 611 to 615, capacitors 621 to 625 and flip flop circuits 631 to 635.

When the control signal Sp is "1", as Illustrated in FIG. 19B, the voltage /VAap is inputted as the voltage Q to the buffer 611, and the voltage /VAbp is inputted as the voltage P to the data input terminals of the flip flop circuits 631 to 635.

When the control signal Sp is "0", as illustrated in FIG. 19C, the voltage /VAbp is inputted as the voltage Q to the buffer 611, and the voltage /VAcp is inputted as the voltage P to the data input terminals of the flip flop circuits 631 to 635.

Figure 20A:
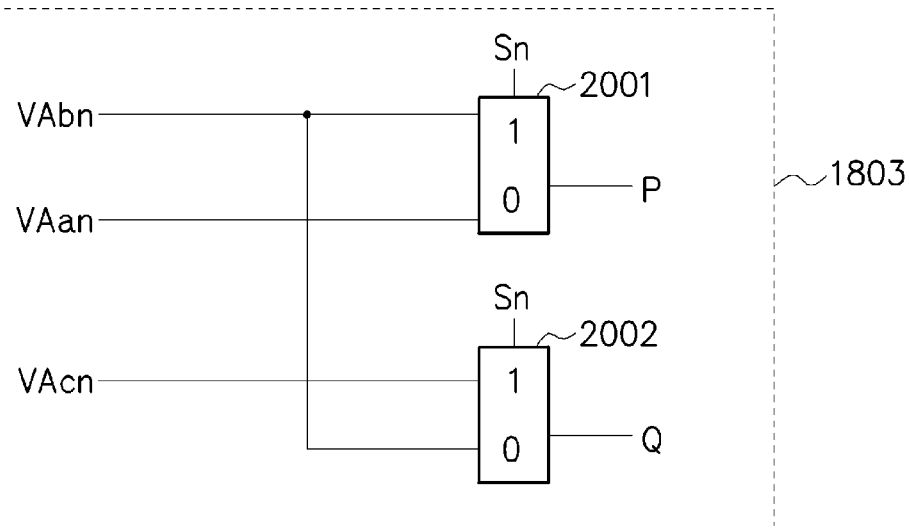
FIG. 20A is a circuit diagram illustrating a configuration example of another part of the selector of FIG. 18.

FIG. 20A is a circuit diagram illustrating a configuration example of another part of the selector 1803 of FIG. 18. The control circuit 1801 sets "1" to a control signal Sn when controlling the number n of parallel connections of the n-channel field effect transistors 116b, and sets "0" to the control signal Sn when controlling the number j of parallel connections of the n-channel field effect transistors 116a. The selector 1803 has selectors 2001, 2002. When the control signal Sn is "1", the selector 2001 outputs the voltage VAbn as the voltage P, and the selector 2002 outputs the voltage VAcn as the voltage Q. When the control signal Sn is "0", the selector 2001 outputs the voltage VAan as the voltage P, and the selector 2002 outputs the voltage VAbn as the voltage Q.

Figure 20B:
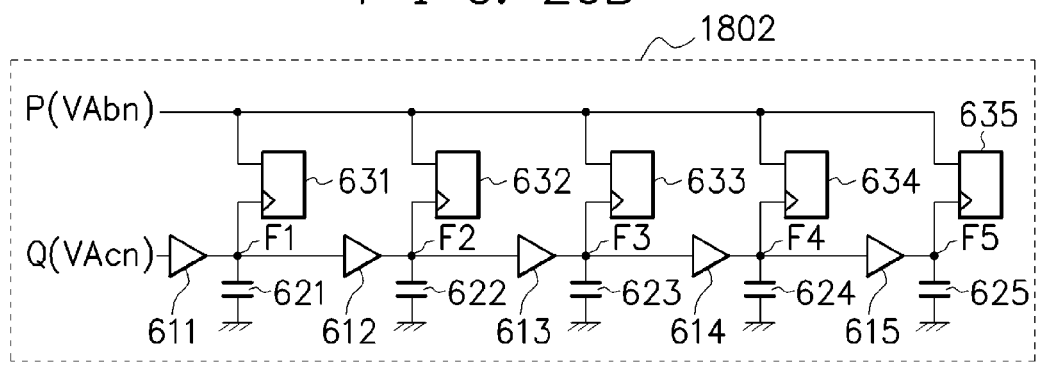
FIGS. 20B and 20C are diagrams illustrating the measurement circuit.

FIG. 20B is a diagram illustrating the measurement circuit 1802 when the control signal Sn is "1". The voltage VAcn is inputted as the voltage Q to the buffer 611, and the voltage VAbn is inputted as the voltage P to the data input terminals of the flip flop circuits 631 to 635.

Figure 20C:
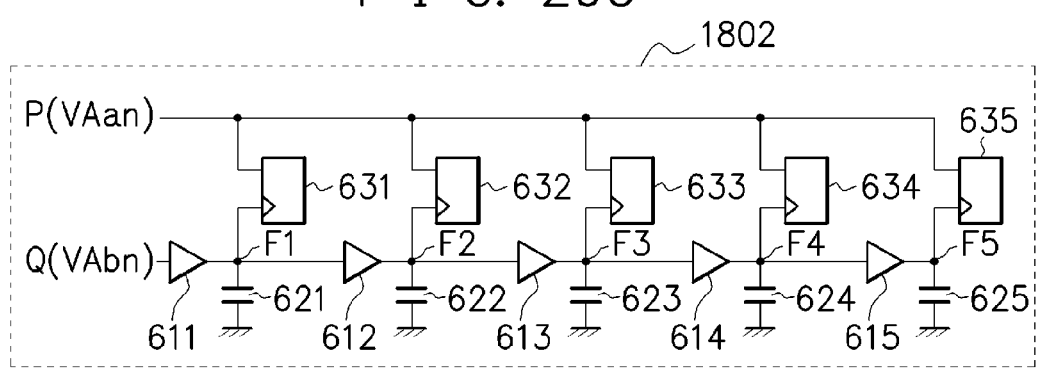

FIG. 20C is a diagram illustrating the measurement circuit 1802 when the control signal Sn is "0". The voltage VAbn is inputted as the voltage Q to the buffer 611, and the voltage VAan is inputted as the voltage P to the data input terminals of the flip flop circuits 631 to 635.

FIG. 21A is a voltage waveform diagram of the output terminal OUT. The second reference voltage V2 is higher than the first reference voltage V1. The third reference voltage V3 is higher than the second reference voltage V2. The reference voltage VH is higher than the third reference voltage V3. The reference voltage VL is lower than the first reference voltage V1.

FIG. 21B is a diagram illustrating a voltage waveform at the time of rising of the output terminal OUT. At time ta, the voltage of the output terminal OUT becomes higher than the first reference voltage V1, and the voltage VAap changes from a value "1" to a value "0". At time tb, the voltage of the output terminal OUT becomes higher than the second reference voltage V2, and the voltage VAbp changes from a value "1" to a value "0". At time tc, the voltage of the output terminal OUT becomes higher than the third reference voltage V3, and the voltage VAcp changes from a value "1" to a value "0". The measurement circuit 1802 measures rising time Δta from time ta to time tb when the control signal Sp is "1". Further, the measurement circuit 1802 measures rising time Δtb from time tb to time tc when the control signal Sp is "0".

FIG. 21C is a diagram illustrating a voltage waveform at the time of falling of the output terminal OUT. At time td, the voltage of the output terminal OUT becomes lower than the third reference voltage V3, and the voltage VAcn changes from a value "0" to a value "1". At time te, the voltage of the output terminal OUT becomes lower than the second reference voltage V2, and the voltage VAbn changes from a value "0" to a value "1". At time tf, the voltage of the output terminal OUT becomes lower than the first reference voltage V1, and the voltage VAan changes from a value "0" to a value "1". The measurement circuit 1802 measures falling time Δtc from time td to time te when the control signal Sn is "1". Further, the measurement circuit 1802 measures falling time Δtd from time te to time tf when the control signal Sn is "0".

Figure 23:
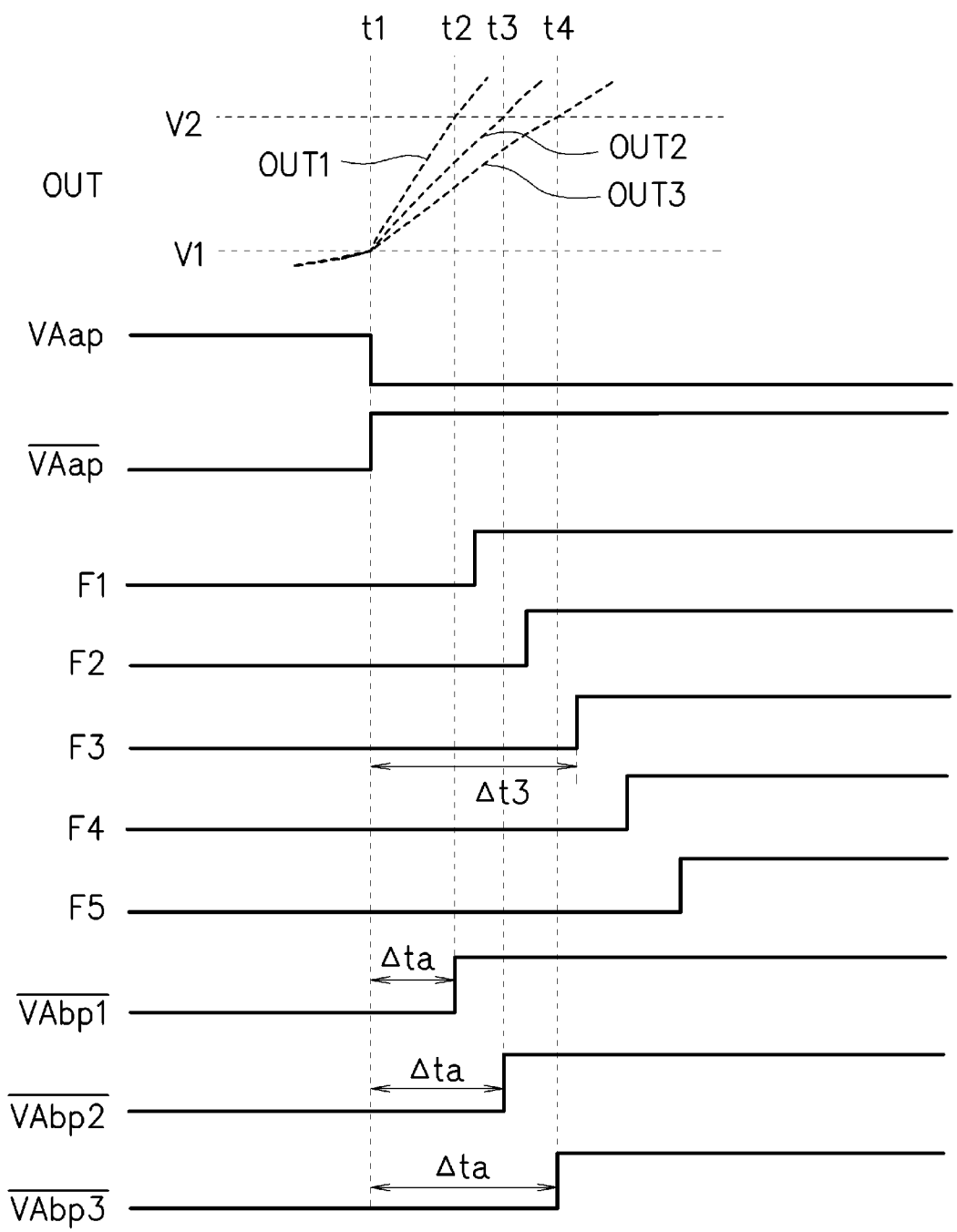
FIG. 23 is a timing chart illustrating a processing example of the output circuit.

FIG. 22 is a flowchart illustrating a processing example in which the output circuit controls the number m of parallel connections of the p-channel field effect transistors 115b and the number k of parallel connections of the p-channel field effect transistors 115c, and FIG. 23 is a timing chart illustrating a processing example of the output circuit.

In step S2201, the control circuit 1801 sets target times of rising times Δta and Δtb. For example, it sets the target time of rising time Ata to Δt3.

Next, in step S2202, the control circuit 1801 sets "1" to the control signal Sp so as to control the number m of parallel connections of p-channel field effect transistors 115b. Then, the selector 1803 outputs the voltage /VAbp as the voltage P, and outputs the voltage /VAap as the voltage Q. Further, the control circuit 1801 controls the number m of parallel connections of the p-channel field effect transistors 115b to be the maximum value.

Next, in step S2203, a voltage falling from a value "1" to a value "0" is inputted to the input terminal IN. Then, the first driver circuit 101 outputs a logically inverted voltage of the voltage of the input terminal IN to the output terminal OUT. The voltage of the output terminal OUT becomes a voltage rising from a value "0" to a value "1".

Here, a voltage OUT1 is the voltage of the output terminal OUT at a time of first loop processing of steps S2203 to S2205. A voltage OUT2 is the voltage of the output terminal OUT at a time of second loop processing of steps S2203 to S2205. A voltage OUT3 is the voltage of the output terminal OUT at a time of third loop processing of steps S2203 to S2205.

Further, a voltage /VAbp1 is the voltage /VAbp at a time of first loop processing of steps S2203 to S2205. A voltage /VAbp2 is the voltage /VAbp at a time of second loop processing of steps S2203 to S2205. A voltage /VAbp3 is the voltage /VAbp at a time of third loop processing of steps S2203 to S2205.

In the first loop processing, the voltage OUT1 and the voltage /VAbp1 will be explained. At time t1, the voltage OUT1 becomes higher than the first reference voltage V1, and thus the voltage VAap falls from high level to low level, and the voltage /VAap rises from low level to high level. The voltage F1 is a delayed voltage of the voltage /VAap. The voltage F2 is a delayed voltage of the voltage F1. The voltage F3 is a delayed voltage of the voltage F2. The voltage F4 is a delayed voltage of the voltage F3. The voltage F5 is a delayed voltage of the voltage F4. At time t2, the voltage OUT1 becomes higher than the second reference voltage V2, and thus the voltage /VAbp1 rises from low level to high level.

In step S2204, the control circuit 1801 measures the rising time Δta from time t1 to time t2. The flip flop circuits 631 to 635 each retain a value "1" of the voltage /VAbp1 at the time of rising of the voltages F1 to F5.

In step S2205, the control circuit 1801 judges whether the rising time Δta from time t1 to time t2 matches the target time Δt3 or not. Specifically, since the values retained in the flip flop circuits 631 to 635 are all "1", the control circuit 1801 judges that the rising time Δta from time t1 to time t2 is shorter than the target time Δ t3, and proceeds to step S2206.

In step S2206, the control circuit 1801 controls the number m of parallel connections of the p-channel field effect transistors 115b to decrease by 1. Thereafter, the control circuit 1801 returns to step S2203, and performs the second loop processing.

In step S2203, the falling voltage is inputted again to the input terminal IN. In this case, the voltage of the output terminal OUT is the voltage OUT2, and the voltage /VAbp is the voltage /VAbp2. At time t1, the voltage OUT2 becomes higher than the first reference voltage V1, and thus the voltage VAap falls from high level to low level and the voltage /VAap rises from low level to high level. At time t3, the voltage OUT2 becomes higher than the second reference voltage V2, and thus the voltage /VAbp2 rises from low level to high level.

In step S2204, the control circuit 1801 measures the rising time Δta from time t1 to time t3. The flip flop circuits 631 to 635 each retain the value of the voltage /VAbp2 at the time of rising of the voltages F1 to F5. The flip flop circuit 631 retains a value "0", and the flip flop circuits 632 to 635 retain a value "1".

In step S2205, since the flip flop circuit 631 retains the value "0" and the flip flop circuits 632 to 635 retain the value "1", the control circuit 1801 judges that the rising time Δta from time t1 to time t3 is shorter than the target time Δt3, and proceeds to step S2206.

In step S2206, the control circuit 1801 controls the number m of parallel connections of the p-channel field effect transistors 115b to further decrease by 1. Thereafter, the control circuit 1801 returns to step S2203, and performs the third loop processing.

In step S2203, the falling voltage is inputted again to the input terminal IN. In this case, the voltage of the output terminal OUT is the voltage OUT3, and the voltage /VAbp is the voltage /VAbp3. At time t1, the voltage OUT3 becomes higher than the first reference voltage V1, and thus the voltage VAap falls from high level to low level and the voltage /VAap rises from low level to high level. At time t4, the voltage OUT3 becomes higher than the second reference voltage V2, and thus the voltage /VAbp3 rises from low level to high level.

In step S2204, the control circuit 1801 measures the rising time Δta from time t1 to time t4. The flip flop circuits 631 to 635 each retain the value of the voltage /VAbp3 at the time of rising of the voltages F1 to F5. The flip flop circuits 631 and 632 retain a value "0", and the flip flop circuits 633 to 635 retain a value "1".

In step S2205, since the flip flop circuits 631 and 632 retain the value "0" and the flip flop circuits 633 to 635 retain the value "1", the control circuit 1801 judges that the rising time Δta from time t1 to time t4 substantially matches the target time Δt3, and finishes the processing.

By the above processing, the number m of parallel connections of the p-channel field effect transistors 115b is controlled so that the rising time Δta substantially matches the target time Δt3, enabling to achieve both high-speed driving and prevention of overshoot. The control circuit 1801 changes the size of the p-channel field effect transistors 115b according to the rising time Δta from the time when the output voltage VAap of the comparison circuit 117ap is inverted to the time when the output voltage VAbp of the comparison circuit 117bp is inverted.

Next, in step S2207, the control circuit 1801 sets "0" to the control signal Sp so as to control the number k of parallel connections of p-channel field effect transistors 115c. Then, the selector 1803 outputs the voltage /VAcp as the voltage P, and outputs the voltage /VAbp as the voltage Q. Further, the control circuit 1801 controls the number k of parallel connections of the p-channel field effect transistors 115c to be the maximum value.

Next, in step S2208, a voltage falling from a value "1" to a value "0" is inputted to the input terminal IN. Then, the first driver circuit 101 outputs a logically inverted voltage of the voltage of the input terminal IN to the output terminal OUT. The voltage of the output terminal OUT becomes a voltage rising from a value "0" to a value "1".

In step S2209, the control circuit 1801 measures the rising time Δtb. The flip flop circuits 631 to 635 each retain a value of the voltage /VAcp at the time of rising of the voltages F1 to F5. The voltages F1 to F5 are delayed voltages of the voltage /VAbp.

In step S2210, similarly to step S2205, the control circuit 1801 judges whether the rising time Δ tb matches the target time or not. When the rising time Δtb is shorter than the target time, the control circuit 1801 proceeds to step S2211. In step S2211, the control circuit 1801 controls the number k of p-channel field effect transistors 115c to decrease by 1. Thereafter, the control circuit 1801 returns to step S2208.

In step S2210, when the rising time Δtb substantially matches the target time, the processing is finished. By the above processing, the number k of parallel connections of the p-channel field effect transistors 115c is controlled so that the rising time Δtb substantially matches the target time, enabling to achieve both high-speed driving and prevention of overshoot. The control circuit 1801 changes the size of the p-channel field effect transistors 115c according to the rising time Δtb from the time when the output voltage VAbp of the comparison circuit 117bp is inverted to the time when the output voltage VAcp of the comparison circuit 117cp is inverted.

Figure 24:
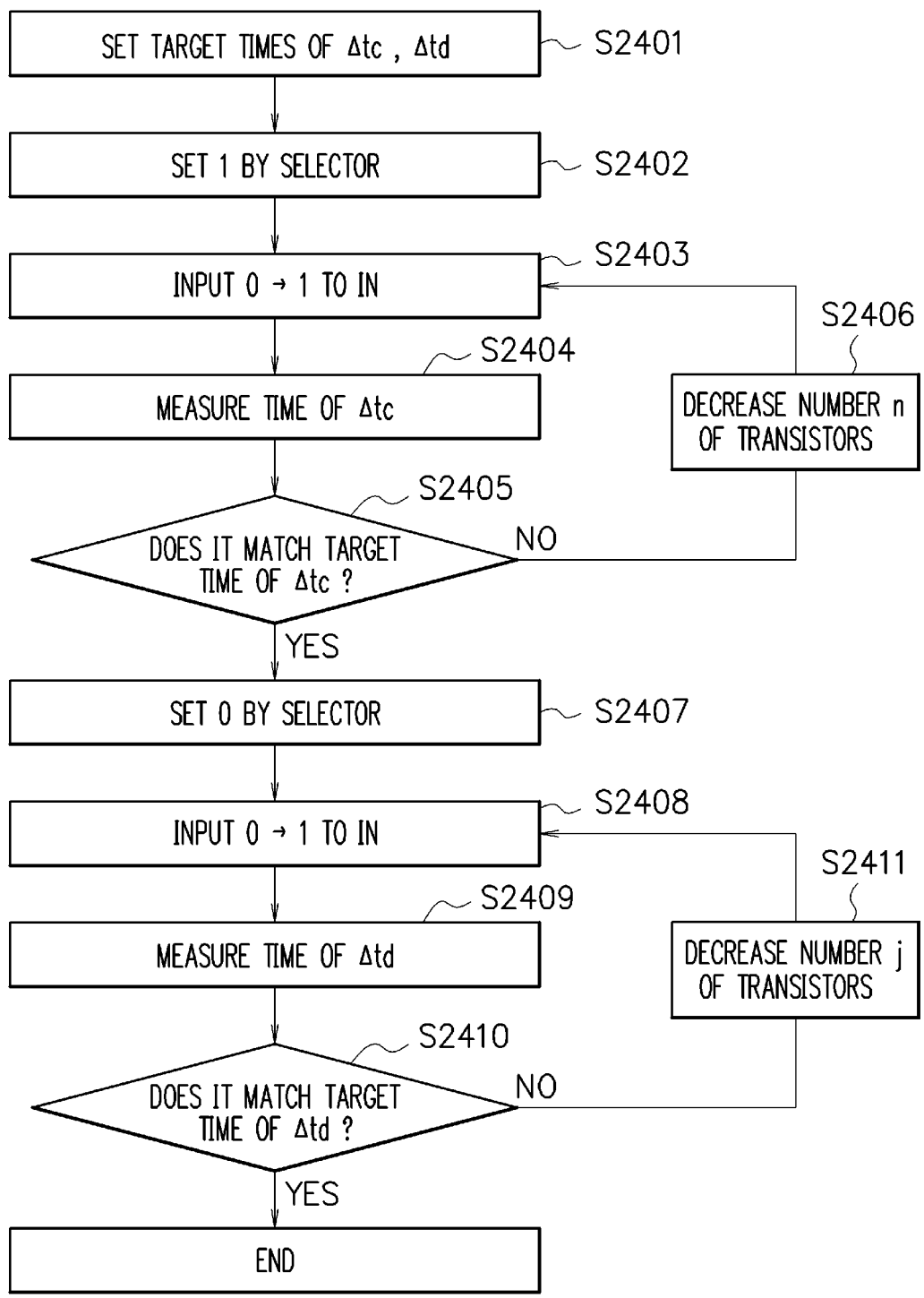
FIG. 24 is a flowchart illustrating a processing example in which the output circuit controls the numbers of parallel connections of the n-channel field effect transistors.
Figure 25:
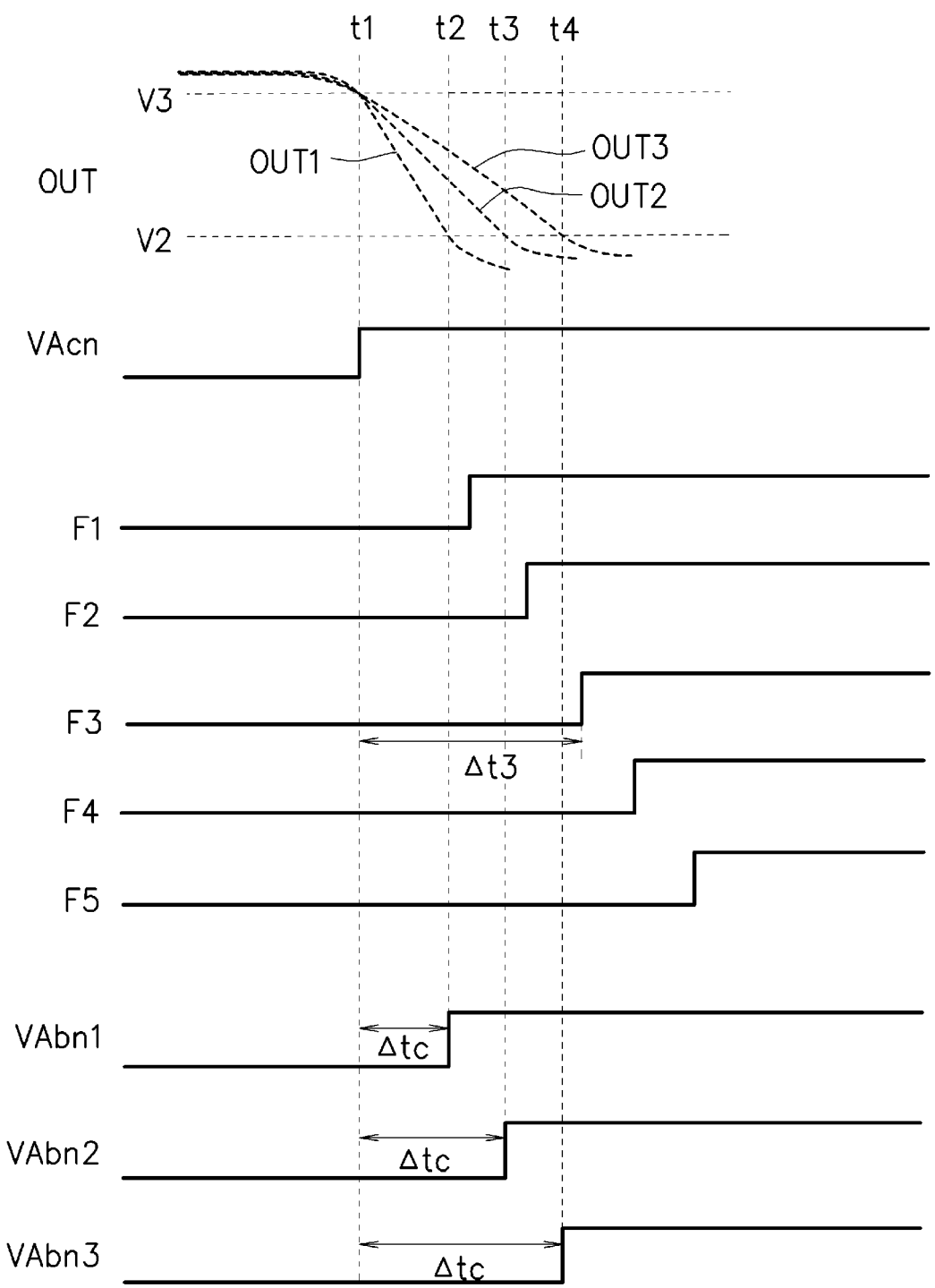
FIG. 25 is a timing chart illustrating a processing example of the output circuit.

FIG. 24 is a flowchart illustrating a processing example in which the output circuit controls the number j of parallel connections of the n-channel field effect transistors 116a and the number n of parallel connections of the n-channel field effect transistors 116b, and FIG. 25 is a timing chart illustrating a processing example of the output circuit.

In step S2401, the control circuit 1801 sets target times of falling times Δtc and Δtd. For example, it sets the target time of falling time Δtc to Δt3.

Next, in step S2402, the control circuit 1801 sets "1" to the control signal Sn so as to control the number n of parallel connections of n-channel field effect transistors 116b. Then, the selector 1803 outputs the voltage VAbn as the voltage P, and outputs the voltage VAcn as the voltage Q. Further, the control circuit 1801 controls the number n of parallel connections of the n-channel field effect transistors 116b to be the maximum value.

Next, in step S2403, a voltage rising from a value "0" to a value "1" is inputted to the input terminal IN. Then, the first driver circuit 101 outputs a logically inverted voltage of the voltage of the input terminal IN to the output terminal OUT. The voltage of the output terminal OUT becomes a voltage falling from a value "1" to a value "0".

Here, a voltage OUT1 is the voltage of the output terminal OUT at a time of first loop processing of steps S2403 to S2405. A voltage OUT2 is the voltage of the output terminal OUT at a time of second loop processing of steps S2403 to S2405. A voltage OUT3 is the voltage of the output terminal OUT at a time of third loop processing of steps S2403 to S2405.

Further, a voltage VAbn1 is the voltage VAbn at a time of first loop processing of steps S2403 to S2405. A voltage VAbn2 is the voltage VAbn at a time of second loop processing of steps S2403 to S2405. A voltage VAbn3 is the voltage VAbn at a time of third loop processing of steps S2403 to S2405.

In the first loop processing, the voltage OUT1 and the voltage VAbn1 will be explained. At time t1, the voltage OUT1 becomes lower than the third reference voltage V3, and thus the voltage VAcn rises from low level to high level. The voltage F1 is a delayed voltage of the voltage VAcn. The voltage F2 is a delayed voltage of the voltage F1. The voltage F3 is a delayed voltage of the voltage F2. The voltage F4 is a delayed voltage of the voltage F3. The voltage F5 is a delayed voltage of the voltage F4. At time t2, the voltage OUT1 becomes lower than the second reference voltage V2, and thus the voltage VAbn1 rises from low level to high level.

In step S2404, the control circuit 1801 measures the falling time Δtc from time t1 to time t2. The flip flop circuits 631 to 635 each retain a value "1" of the voltage VAbn1 at the time of rising of the voltages F1 to F5.

In step S2405, the control circuit 1801 judges whether the falling time Δtc from time t1 to time t2 matches the target time Δt3 or not. Specifically, since the values retained in the flip flop circuits 631 to 635 are all "1", the control circuit 1801 judges that the falling time Δtc from time t1 to time t2 is shorter than the target time Δ t3, and proceeds to step S2406.

In step S2406, the control circuit 1801 controls the number n of parallel connections of the n-channel field effect transistors 116b to decrease by 1. Thereafter, the control circuit 1801 returns to step S2403, and performs the second loop processing.

In step S2403, the rising voltage is inputted again to the input terminal IN. In this case, the voltage of the output terminal OUT is the voltage OUT2, and the voltage VAbn is the voltage VAbn2. At time t1, the voltage OUT2 becomes lower than the third reference voltage V3, and thus the voltage VAcn rises from low level to high level. At time t3, the voltage OUT2 becomes lower than the second reference voltage V2, and thus the voltage VAbn2 rises from low level to high level.

In step S2404, the control circuit 1801 measures the falling time Δtc from time t1 to time t3. The flip flop circuits 631 to 635 each retain the value of the voltage VAbn2 at the time of rising of the voltages F1 to F5. The flip flop circuit 631 retains a value "0", and the flip flop circuits 632 to 635 retain a value "1".

In step S2405, since the flip flop circuit 631 retains the value "0" and the flip flop circuits 632 to 635 retain the value "1", the control circuit 1801 judges that the falling time Δtc from time t1 to time t3 is shorter than the target time Δt3, and proceeds to step S2406.

In step S2406, the control circuit 1801 controls the number n of parallel connections of the n-channel field effect transistors 116b to further decrease by 1. Thereafter, the control circuit 1801 returns to step S2403, and performs the third loop processing.

In step S2403, the rising voltage is inputted again to the input terminal IN. In this case, the voltage of the output terminal OUT is the voltage OUT3, and the voltage VAbn is the voltage VAbn3. At time t1, the voltage OUT3 becomes lower than the third reference voltage V3, and thus the voltage VAcn rises from low level to high level. At time t4, the voltage OUT3 becomes lower than the second reference voltage V2, and thus the voltage VAbn3 rises from low level to high level.

In step S2404, the control circuit 1801 measures the falling time Δtc from time t1 to time t4. The flip flop circuits 631 to 635 each retain the value of the voltage VAbn3 at the time of rising of the voltages F1 to F5. The flip flop circuits 631 and 632 retain a value "0", and the flip flop circuits 633 to 635 retain a value "1".

In step S2405, since the flip flop circuits 631 and 632 retain the value "0" and the flip flop circuits 633 to 635 retain the value "1", the control circuit 1801 judges that the falling time Δtc from time t1 to time t4 substantially matches the target time Δt3, and finishes the processing.

By the above processing, the number n of parallel connections of the n-channel field effect transistors 116b is controlled so that the falling time Δtc substantially matches the target time Δt3, enabling to achieve both high-speed driving and prevention of undershoot. The control circuit 1801 changes the size of the n-channel field effect transistors 116b according to the falling time Δtc from the time when the output voltage VAcn of the comparison circuit 117cn is inverted to the time when the output voltage VAbn of the comparison circuit 117bn is inverted.

Next, in step S2407, the control circuit 1801 sets "0" to the control signal Sn so as to control the number j of parallel connections of n-channel field effect transistors 116a. Then, the selector 1803 outputs the voltage VAan as the voltage P, and outputs the voltage VAbn as the voltage Q. Further, the control circuit 1801 controls the number j of parallel connections of the n-channel field effect transistors 116a to be the maximum value.

Next, in step S2408, a voltage rising from a value "0" to a value "1" is inputted to the input terminal IN. Then, the first driver circuit 101 outputs a logically inverted voltage of the voltage of the input terminal IN to the output terminal OUT. The voltage of the output terminal OUT becomes a voltage falling from a value "1" to a value "0".

In step S2409, the control circuit 1801 measures the falling time Δtd. The flip flop circuits 631 to 635 each retain a value of the voltage VAan at the time of rising of the voltages F1 to F5. The voltages F1 to F5 are delayed voltages of the voltage VAbn.

In step S2410, similarly to step S2405, the control circuit 1801 judges whether the falling time Δtd matches the target time or not. When the falling time Δtd is shorter than the target time, the control circuit 1801 proceeds to step S2411. In step S2411, the control circuit 1801 controls the number j of n-channel field effect transistors 116a to decrease by 1. Thereafter, the control circuit 1801 returns to step S2408.

In step S2410, when the falling time Δtd substantially matches the target time, the processing is finished. By the above processing, the number j of parallel connections of the n-channel field effect transistors 116a is controlled so that the falling time Δtd substantially matches the target time, enabling to achieve both high-speed driving and prevention of undershoot. The control circuit 1801 changes the size of the n-channel field effect transistors 116a according to the falling time Δtd from the time when the output voltage VAbn of the comparison circuit 117bn is inverted to the time when the output voltage VAan of the comparison circuit 117an is inverted.

Sixth Embodiment

FIG. 26 is a diagram illustrating a configuration example of an integrated circuit 2600 according to a sixth embodiment. The integrated circuit 2600 has a data generation circuit 2601, a parallel-serial converter 2602, a central processing unit (CPU) 2603, a bus 2604 and a plurality of output circuits 2605. The plurality of output circuits 2605 correspond to the output circuit of any one of the first to fifth embodiments. The central processing unit 2603 controls the plurality of output circuits 2605 via the bus 2604. The data generation circuit 2601 generates data. The parallel-serial converter 2602 converts the data generated by the data generation circuit 2601 from a parallel format to a serial format, and outputs a plurality of serial data to each of the plurality of output circuits 2605. The plurality of output circuits 2605 each adjust a voltage waveform of data inputted from the parallel-serial converter 2602 as in the first to fifth embodiments, and outputs data in which an overshoot and an undershoot are prevented.

It should be noted that the above embodiments merely illustrate specific examples for carrying out the present invention, and the technical scope of the invention should not be construed as limited by these embodiments. That is, the invention may be implemented in various forms without departing from the technical spirit or main features thereof.

By providing the first and second driver circuits, driving speed can be made high, and an overshoot or an undershoot of an output voltage can be prevented with high accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An output circuit, comprising:
   a first driver circuit configured to receive a voltage of an input terminal and output a first voltage to an output terminal;
   a first comparison circuit configured to compare a first reference voltage with a voltage of the output terminal;
   a second driver circuit configured to receive the voltage of the input terminal and output a second voltage to the output terminal and become an off state according to a comparison result of the first comparison circuit;
   a second comparison circuit configured to compare a second reference voltage different from the first reference voltage with the voltage of the output terminal; and
   a third driver circuit configured to receive the voltage of the input terminal and output a third voltage to the output terminal and become an off state according to a comparison result of the second comparison circuit.

2. The output circuit according to claim 1, wherein the second driver circuit comprises:

a first p-channel field effect transistor which includes a source connected to a first potential node and a drain connected to the output terminal;

a first n-channel field effect transistor which includes a source connected to a second potential node having a potential lower than a potential of the first potential node and a drain connected to the output terminal;

a first selector configured to receive an output signal of the first comparison circuit, connect a gate of the first p-channel field effect transistor to the input terminal when the voltage of the output terminal is lower than the first reference voltage, and connect the gate of the first p-channel field effect transistor to the first potential node when the voltage of the output terminal is higher than the first reference voltage; and a second selector configured to receive the output signal of the first comparison circuit, connect a gate of the first n-channel field effect transistor to the input terminal when the voltage of the output terminal is higher than the first reference voltage, and connect the gate of the first n-channel field effect transistor to the second potential node when the voltage of the output terminal is lower than the first reference voltage, and wherein the third driver circuit comprises:

a second p-channel field effect transistor which includes a source connected to the first potential node and a drain connected to the output terminal;

a second n-channel field effect transistor which includes a source connected to the second potential node and a drain connected to the output terminal;

a third selector configured to receive an output signal of the second comparison circuit, connect a gate of the second p-channel field effect transistor to the input terminal when the voltage of the output terminal is lower than the second reference voltage, and connect the gate of the second p-channel field effect transistor to the first potential node when the voltage of the output terminal is higher than the second reference voltage; and a fourth selector configured to receive the output signal of the second comparison circuit, connect a gate of the second n-channel field effect transistor to the input terminal when the voltage of the output terminal is higher than the second reference voltage, and connect the gate of the second n-channel field effect transistor to the second potential node when the voltage of the output terminal is lower than the second reference voltage.

3. The output circuit according to claim 2, further comprising:

a third comparison circuit configured to compare a third reference voltage different from the first and second reference voltages with the voltage of the output terminal; and a fourth driver circuit configured to receive the voltage of the input terminal and output a voltage to the output terminal and become an off state according to a comparison result of the third comparison circuit, wherein the fourth driver circuit comprises:

a third p-channel field effect transistor which includes a source connected to the first potential node and a drain connected to the output terminal;

a third n-channel field effect transistor which includes a source connected to the second potential node and a drain connected to the output terminal;

a fifth selector configured to receive an output signal of the third comparison circuit, connect a gate of the third p-channel field effect transistor to the input terminal when the voltage of the output terminal is lower than the third reference voltage, and connect the gate of the third p-channel field effect transistor to the first potential node when the voltage of the output terminal is higher than the third reference voltage; and a sixth selector configured to receive the output signal of the third comparison circuit, connect a gate of the third n-channel field effect transistor to the input terminal when the voltage of the output terminal is higher than the third reference voltage, and connect the gate of the third n-channel field effect transistor to the second potential node when the voltage of the output terminal is lower than the third reference voltage.

4. The output circuit according to claim 2, wherein the second reference voltage is higher than the first reference voltage, the output circuit further comprising a control circuit configured to change a size of the second p-channel field effect transistor according to a rising time of the voltage of the input terminal from a time when the output signal of the first comparison circuit is inverted to a time when the output signal of the second comparison circuit is inverted.

5. The output circuit according to claim 2, wherein the second reference voltage is higher than the first reference voltage, the output circuit further comprising a control circuit configured to change a size of the first n-channel field effect transistor according to a falling time of the voltage of the input terminal from a time when the output signal of the second comparison circuit is inverted to a time when the output signal of the first comparison circuit is inverted.

6. The output circuit according to claim 1, wherein the second reference voltage is higher than the first reference voltage, a third reference voltage is lower than the first reference voltage, a fourth reference voltage is higher than the second reference voltage, the first comparison circuit is configured to compare the voltage of the output terminal with the first reference voltage at a time of rising of the voltage of the output terminal, and compare the voltage of the output terminal with the third reference voltage at a time of falling of the voltage of the output terminal, and the second comparison circuit is configured to compare the voltage of the output terminal with the second reference voltage at a time of rising of the voltage of the output terminal, and compare the voltage of the output terminal with the third reference voltage at a time of falling of the voltage of the output terminal, the output circuit further comprising:

a third comparison circuit configured to compare the voltage of the output terminal with the first reference voltage at a time of falling of the voltage of the output terminal, and compare the voltage of the output terminal with the fourth reference voltage at a time of rising of the voltage of the output terminal; and a fourth comparison circuit configured to compare the voltage of the output terminal with the second reference voltage at a time of falling of the voltage of the output terminal, and compare the voltage of the output terminal with the fourth reference voltage at a time of rising of the voltage of the output terminal, wherein the second driver circuit comprises:

a first p-channel field effect transistor which includes a source connected to a first potential node and a drain connected to the output terminal;

a first n-channel field effect transistor which includes a source connected to a second potential node having a potential lower than a potential of the first potential node and a drain connected to the output terminal;

a first selector configured to receive an output signal of the first comparison circuit, the first selector being configured to, at a time of rising of the voltage of the output terminal, connect a gate of the first p-channel field effect transistor to the input terminal when the voltage of the output terminal is lower than the first reference voltage, and connect the gate of the first p-channel field effect transistor to the first potential node when the voltage of the output terminal is higher than the first reference voltage, the first selector being configured to, at a time of falling of the voltage of the output terminal, connect the gate of the first p-channel field effect transistor to the first potential node when the voltage of the output terminal is higher than the third reference voltage, and connect the gate of the first p-channel field effect transistor to the input terminal when the voltage of the output terminal is lower than the third reference voltage; and a second selector configured to receive an output signal of the third comparison circuit, the second selector being configured to, at a time of falling of the voltage of the output terminal, connect a gate of the first n-channel field effect transistor to the input terminal when the voltage of the output terminal is higher than the first reference voltage, and connect the gate of the first n-channel field effect transistor to the second potential node when the voltage of the output terminal is lower than the first reference voltage, the second selector being configured to, at a time of rising of the voltage of the output terminal, connect the gate of the first n-channel field effect transistor to the second potential node when the voltage of the output terminal is lower than the fourth reference voltage, and connect the gate of the first n-channel field effect transistor to the input terminal when the voltage of the output terminal is higher than the fourth reference voltage, and wherein the third driver circuit comprises:

a second p-channel field effect transistor which includes a source connected to the first potential node and a drain connected to the output terminal;

a second n-channel field effect transistor which includes a source connected to the second potential node and a drain connected to the output terminal;

a third selector configured to receive an output signal of the second comparison circuit, the third selector being configured to, at a time of rising of the voltage of the output terminal, connect a gate of the second p-channel field effect transistor to the input terminal when the voltage of the output terminal is lower than the second reference voltage, and connect the gate of the second p-channel field effect transistor to the first potential node when the voltage of the output terminal is higher than the second reference voltage, the third selector being configured to, at a time of falling of the voltage of the output terminal, connect the gate of the second p-channel field effect transistor to the first potential node when the voltage of the output terminal is higher than the third reference voltage, and connect the gate of the second p-channel field effect transistor to the input terminal when the voltage of the output terminal is lower than the third reference voltage; and a fourth selector configured to receive an output signal of the fourth comparison circuit, the fourth selector being configured to, at a time of falling of the voltage of the output terminal, connect a gate of the second n-channel field effect transistor to the input terminal when the voltage of the output terminal is higher than the second reference voltage, and connect the gate of the second n-channel field effect transistor to the second potential node when the voltage of the output terminal is lower than the second reference voltage, the fourth selector being configured to, at a time of rising of the voltage of the output terminal, connect the gate of the second n-channel field effect transistor to the second potential node when the voltage of the output terminal is lower than the fourth reference voltage, and connect the gate of the second n-channel field effect transistor to the input terminal when the voltage of the output terminal is higher than the fourth reference voltage.

7. The output circuit according to claim 6, wherein the fifth reference voltage is higher than the second reference voltage and is lower than the fourth reference voltage, the output circuit further comprising:

a fifth comparison circuit configured to compare the voltage of the output terminal with the fifth reference voltage at a time of rising of the voltage of the output terminal, and compare the voltage of the output terminal with the third reference voltage at a time of falling of the voltage of the output terminal;

a sixth comparison circuit configured to compare the voltage of the output terminal with the fifth reference voltage at a time of falling of the voltage of the output terminal, and compare the voltage of the output terminal with the fourth reference voltage at a time of rising of the voltage of the output terminal; and a fourth driver circuit, and wherein the fourth driver circuit comprises:

a third p-channel field effect transistor which includes a source connected to the first potential node and a drain connected to the output terminal;

a third n-channel field effect transistor which includes a source connected to the second potential node and a drain connected to the output terminal;

a fifth selector configured to receive an output signal of the fifth comparison circuit, the fifth selector being configured to, at a time of rising of the voltage of the output terminal, connect a gate of the third p-channel field effect transistor to the input terminal when the voltage of the output terminal is lower than the fifth reference voltage, and connect the gate of the third p-channel field effect transistor to the first potential node when the voltage of the output terminal is higher than the fifth reference voltage, the fifth selector being configured to, at a time of falling of the voltage of the output terminal, connect the gate of the third p-channel field effect transistor to the first potential node when the voltage of the output terminal is higher than the third reference voltage, and connect the gate of the third p-channel field effect transistor to the input terminal when the voltage of the output terminal is lower than the third reference voltage; and a sixth selector configured to receive an output signal of the sixth comparison circuit, the sixth selector being configured to, at a time of falling of the voltage of the output terminal, connect a gate of the third n-channel field effect transistor to the input terminal when the voltage of the output terminal is higher than the fifth reference voltage, and connect the gate of the third n-channel field effect transistor to the second potential node when the voltage of the output terminal is lower than the fifth reference voltage, the sixth selector being configured to, at a time of rising of the voltage of the output terminal, connect the gate of the third n-channel field effect transistor to the second potential node when the voltage of the output terminal is lower than the fourth reference voltage, and connect the gate of the third n-channel field effect transistor to the input terminal when the voltage of the output terminal is higher than the fourth reference voltage.

8. The output circuit according to claim 6, further comprising a control circuit configured to change a size of the second p-channel field effect transistor according to a rising time of the voltage of the input terminal from a time when the output signal of the first comparison circuit is inverted to a time when the output signal of the second comparison circuit is inverted.

9. The output circuit according to claim 6, further comprising a control circuit configured to change a size of the first n-channel field effect transistor according to a falling time of the voltage of the input terminal from a time when the output signal of the fourth comparison circuit is inverted to a time when the output signal of the third comparison circuit is inverted.

10. The output circuit according to claim 7, further comprising a control circuit, wherein the control circuit is configured to
change a size of the second p-channel field effect transistor according to a rising time of the voltage of the input terminal from a time when the output signal of the first comparison circuit is inverted to a time when the output signal of the second comparison circuit is inverted,
change a size of the third p-channel field effect transistor according to a rising time of the voltage of the input terminal from a time when the output signal of the second comparison circuit is inverted to a time when the output signal of the fifth comparison circuit is inverted,
change a size of the first n-channel field effect transistor according to a falling time of the voltage of the input terminal from a time when the output signal of the fourth comparison circuit is inverted to a time when the output signal of the third comparison circuit is inverted, and
change a size of the second n-channel field effect transistor according to a falling time of the voltage of the input terminal from a time when the output signal of the sixth comparison circuit is inverted to a time when the output signal of the fourth comparison circuit is inverted.

11. An integrated circuit, comprising:
a data generation circuit configured to generate data; and
an output circuit configured to receive the data generated by the data generation circuit,
wherein the output circuit comprises:
a first driver circuit configured to receive a voltage of an input terminal and output a first voltage to an output terminal;
a first comparison circuit configured to compare a first reference voltage with a voltage of the output terminal;
a second driver circuit configured to receive the voltage of the input terminal and output a second voltage to the output terminal and become an off state according to a comparison result of the first comparison circuit;
a second comparison circuit configured to compare a second reference voltage different from the first reference voltage with the voltage of the output terminal; and
a third driver circuit configured to receive the voltage of the input terminal and output a third voltage to the output terminal and become an off state according to a comparison result of the second comparison circuit.

12. The integrated circuit according to claim 11, wherein the second driver circuit comprises:
a first p-channel field effect transistor which includes a source connected to a first potential node and a drain connected to the output terminal;
a first n-channel field effect transistor which includes a source connected to a second potential node having a potential lower than a potential of the first potential node and a drain connected to the output terminal;
a first selector configured to receive an output signal of the first comparison circuit, connect a gate of the first p-channel field effect transistor to the input terminal when the voltage of the output terminal is lower than the first reference voltage, and connect the gate of the first p-channel field effect transistor to the first potential node when the voltage of the output terminal is higher than the first reference voltage; and
a second selector configured to receive the output signal of the first comparison circuit, connect a gate of the first n-channel field effect transistor to the input terminal when the voltage of the output terminal is higher than the first reference voltage, and connect the gate of the first n-channel field effect transistor to the second potential node when the voltage of the output terminal is lower than the first reference voltage, and
wherein the third driver circuit comprises:
a second p-channel field effect transistor which includes a source connected to the first potential node and a drain connected to the output terminal;
a second n-channel field effect transistor which includes a source connected to the second potential node and a drain connected to the output terminal;
a third selector configured to receive an output signal of the second comparison circuit, connect a gate of the second p-channel field effect transistor to the input terminal when the voltage of the output terminal is lower than the second reference voltage, and connect the gate of the second p-channel field effect transistor to the first potential node when the voltage of the output terminal is higher than the second reference voltage; and
a fourth selector configured to receive the output signal of the second comparison circuit, connect a gate of the second n-channel field effect transistor to the input terminal when the voltage of the output terminal is higher than the second reference voltage, and connect the gate of the second n-channel field effect transistor to the second potential node when the voltage of the output terminal is lower than the second reference voltage.

13. The integrated circuit according to claim 11, wherein the second reference voltage is higher than the first reference voltage,
a third reference voltage is lower than the first reference voltage,
a fourth reference voltage is higher than the second reference voltage, the first comparison circuit is configured to compare the voltage of the output terminal with the first reference voltage at a time of rising of the voltage of the output terminal, and compare the voltage of the output terminal with the third reference voltage at a time of falling of the voltage of the output terminal, and the second comparison circuit is configured to compare the voltage of the output terminal with the second reference voltage at a time of rising of the voltage of the output terminal, and compare the voltage of the output terminal with the third reference voltage at a time of falling of the voltage of the output terminal, the output circuit further comprising:

a third comparison circuit configured to compare the voltage of the output terminal with the first reference voltage at a time of falling of the voltage of the output terminal, and compare the voltage of the output terminal with the fourth reference voltage at a time of rising of the voltage of the output terminal; and a fourth comparison circuit configured to compare the voltage of the output terminal with the second reference voltage at a time of falling of the voltage of the output terminal, and compare the voltage of the output terminal with the fourth reference voltage at a time of rising of the voltage of the output terminal, wherein the second driver circuit comprises:

a first p-channel field effect transistor which include a source connected to a first potential node and a drain connected to the output terminal;

a first n-channel field effect transistor which include a source connected to a second potential node having a potential lower than a potential of the first potential node and a drain connected to the output terminal;

a first selector configured to receive an output signal of the first comparison circuit, the first selector being configured to, at a time of rising of the voltage of the output terminal, connect a gate of the first p-channel field effect transistor to the input terminal when the voltage of the output terminal is lower than the first reference voltage, and connect the gate of the first p-channel field effect transistor to the first potential node when the voltage of the output terminal is higher than the first reference voltage, the first selector being configured to, at a time of falling of the voltage of the output terminal, connect the gate of the first p-channel field effect transistor to the first potential node when the voltage of the output terminal is higher than the third reference voltage, and connect the gate of the first p-channel field effect transistor to the input terminal when the voltage of the output terminal is lower than the third reference voltage; and a second selector configured to receive an output signal of the third comparison circuit, the second selector being configured to, at a time of falling of the voltage of the output terminal, connect a gate of the first n-channel field effect transistor to the input terminal when the voltage of the output terminal is higher than the first reference voltage, and connect the gate of the first n-channel field effect transistor to the second potential node when the voltage of the output terminal is lower than the first reference voltage, the second selector being configured to, at a time of rising of the voltage of the output terminal, connect the gate of the first n-channel field effect transistor to the second potential node when the voltage of the output terminal is lower than the fourth reference voltage, and connect the gate of the first n-channel field effect transistor to the input terminal when the voltage of the output terminal is higher than the fourth reference voltage, and wherein the third driver circuit comprises:

a second p-channel field effect transistor which includes a source connected to the first potential node and a drain connected to the output terminal;

a second n-channel field effect transistor which includes a source connected to the second potential node and a drain connected to the output terminal;

a third selector configured to receive an output signal of the second comparison circuit, the third selector being configured to, at a time of rising of the voltage of the output terminal, connect a gate of the second p-channel field effect transistor to the input terminal when the voltage of the output terminal is lower than the second reference voltage, and connect the gate of the second p-channel field effect transistor to the first potential node when the voltage of the output terminal is higher than the second reference voltage, the third selector being configured to, at a time of falling of the voltage of the output terminal, connect the gate of the second p-channel field effect transistor to the first potential node when the voltage of the output terminal is higher than the third reference voltage, and connect the gate of the second p-channel field effect transistor to the input terminal when the voltage of the output terminal is lower than the third reference voltage; and a fourth selector configured to receive an output signal of the fourth comparison circuit, the fourth selector being configured to, at a time of falling of the voltage of the output terminal, connect a gate of the second n-channel field effect transistor to the input terminal when the voltage of the output terminal is higher than the second reference voltage, and connect the gate of the second n-channel field effect transistor to the second potential node when the voltage of the output terminal is lower than the second reference voltage, the fourth selector being configured to, at a time of rising of the voltage of the output terminal, connect the gate of the second n-channel field effect transistor to the second potential node when the voltage of the output terminal is lower than the fourth reference voltage, and connect the gate of the second n-channel field effect transistor to the input terminal when the voltage of the output terminal is higher than the fourth reference voltage.

* * * * *